(12) United States Patent
Jang et al.

(10) Patent No.: US 9,224,699 B2
(45) Date of Patent: Dec. 29, 2015

(54) METHOD OF MANUFACTURING SEMICONDUCTOR PACKAGE HAVING MAGNETIC SHIELD UNIT

(71) Applicants: Jae-Gwon Jang, Hwaseong-si (KR); Jin-Woo Park, Seoul (KR); Jong-Ho Lee, Hwaseong-si (KR)

(72) Inventors: Jae-Gwon Jang, Hwaseong-si (KR); Jin-Woo Park, Seoul (KR); Jong-Ho Lee, Hwaseong-si (KR)

(73) Assignee: Samsung Electronics Co., LTD., Gyeonggi-do (KR)

( * ) Notice: Subject to any disclaimer, the term of this patent is extended or adjusted under 35 U.S.C. 154(b) by 0 days.

(21) Appl. No.: 14/490,105

(22) Filed: Sep. 18, 2014

(65) Prior Publication Data

US 2015/0243607 A1 Aug. 27, 2015

(30) Foreign Application Priority Data

Feb. 21, 2014 (KR) .................. 10-2014-0020671

(51) Int. Cl.
| | |
|---|---|
| *H01L 23/552* | (2006.01) |
| *H01L 29/82* | (2006.01) |
| *H01L 21/00* | (2006.01) |
| *H01L 23/00* | (2006.01) |
| *H01L 21/78* | (2006.01) |
| *H01L 23/31* | (2006.01) |

(52) U.S. Cl.
CPC .............. *H01L 23/564* (2013.01); *H01L 21/78* (2013.01); *H01L 23/3142* (2013.01); *H01L 24/48* (2013.01); *H01L 24/50* (2013.01); *H01L 24/86* (2013.01); *H01L 2224/85005* (2013.01)

(58) Field of Classification Search
CPC ... H01L 23/13; H01L 23/552; H01L 23/5389; H01L 24/32; H01L 23/49816; H01L 24/16

USPC .................. 257/421, 659, E23.114, E21.502; 438/3, 122, 127, 55, 114, 126
See application file for complete search history.

(56) References Cited

U.S. PATENT DOCUMENTS

| | | | |
|---|---|---|---|
| 7,981,730 | B2 | 7/2011 | Tang et al. |
| 8,097,494 | B2 | 1/2012 | Tang et al. |
| 2005/0130327 | A1 | 6/2005 | Spielberger et al. |
| 2006/0019422 | A1 | 1/2006 | Tuttle et al. |
| 2012/0119338 | A1 | 5/2012 | Watanabe et al. |
| 2012/0193737 | A1 | 8/2012 | Pang et al. |
| 2012/0211846 | A1 | 8/2012 | Li et al. |
| 2013/0105950 | A1 | 5/2013 | Bergemont et al. |

FOREIGN PATENT DOCUMENTS

| | | |
|---|---|---|
| JP | 2003115578 A | 4/2003 |
| JP | 201114225 | 6/2011 |

*Primary Examiner* — Long K Tran
*Assistant Examiner* — Dzung Tran
(74) *Attorney, Agent, or Firm* — Harness, Dickey & Pierce

(57) ABSTRACT

A method of manufacturing a semiconductor package having a magnetic shield function is provided. The method includes forming cracks in a lattice structure on an active surface in which electrode terminals are formed; grinding a back surface of a wafer facing the active surface, bonding a tape on the active surface of the wafer, expanding the tape such that the wafer on the tape is divided as semiconductor chips, forming a shield layer on surfaces of the semiconductor chips and the tape, cutting the shield layer between the semiconductor chips and individualizing as each of the semiconductor chips which has a first shield pattern formed on back surface and sides, bonding the semiconductor chips on a substrate, and forming a second shield pattern on each of the active surfaces of the semiconductor chips, wherein the semiconductor chips and the substrate are physically and electrically connected by a bonding wire.

20 Claims, 24 Drawing Sheets

METHOD OF MANUFACTURING SEMICONDUCTOR PACKAGE HAVING MAGNETIC SHIELD UNIT

CROSS-REFERENCE TO RELATED APPLICATION

This application claims priority under 35 U.S.C. §119 from Korean Patent Application No. 10-2014-0020671 filed on Feb. 21, 2014, the contents of which are incorporated herein by reference in their entirety.

BACKGROUND

1. Field

Example embodiments of the inventive concepts relate to a method of manufacturing a semiconductor package including a magnetoresistive random access memory (MRAM) device.

2. Description of Related Art

Various technologies are being proposed for shielding an external magnetic field such that a magnetoresistive random access memory (MRAM) device is not influenced by the external magnetic field.

SUMMARY

Example embodiments of the inventive concepts provide a method of manufacturing a semiconductor package configured such that a magnetoresistor random access memory (MRAM) device is not influenced by an external magnetic field.

The technical objectives of the inventive concepts are not limited to the above disclosure; other objectives may become apparent to those of ordinary skill in the art based on the following descriptions.

In accordance with at least one example of the inventive concepts, a method of manufacturing a semiconductor package includes forming cracks in a lattice structure on an active surface in which electrode terminals are formed, grinding a back surface of a wafer facing the active surface, bonding a tape on the active surface of the wafer, expanding the tape such that the wafer on the tape is divided as semiconductor chips, forming a shield layer on surfaces of the semiconductor chips and the tape, cutting the shield layer between the semiconductor chips, and sectioning off each of the semiconductor chips which has a first shield pattern formed on a back surface and sides, bonding the semiconductor chips on a substrate, and forming a second shield pattern on each of the active surfaces of the semiconductor chips, wherein the semiconductor chips and the substrate are physically and electrically connected by a bonding wire.

The forming of the cracks in the lattice structure on the wafer may include irradiating the active surface of the wafer with a laser beam in the lattice structure.

The bonding of the semiconductor chips to the substrate may include bonding an adhesive film on an upper surface of the shield layer, forming a first bonding layer on a lower surface of the first shield pattern by contemporaneously or simultaneously cutting the shield layer and the adhesive film, and bonding the first bonding layer to the substrate.

The method may further include forming a buffer layer between the semiconductor chips and the shield layer.

The method may further include forming a molding enveloping the semiconductor chips and the bonding wire, cutting the molding and the substrate, and sectioning off a single semiconductor package including each of the semiconductor chips.

The method may further include stacking another semiconductor chip with the same structure as the semiconductor chip between the semiconductor chip and the second shield pattern.

The method may further include forming an inter chip bonding layer between the stacked semiconductor chips to cover one end of the bonding wire and bond the stacked semiconductor chips.

The inter chip bonding layer may include epoxy-based resins and silicon-based resins.

The forming of the second shield pattern may include bonding the second shield pattern which is previously manufactured in the form of a thin film on the surfaces of the semiconductor chips.

The first shield pattern and the second shield pattern may include permalloy that is an alloy of Fe and Ni.

In accordance with another example of the inventive concepts, a method of manufacturing a semiconductor package includes preparing a wafer having an active surface in which electrode terminals are formed, and a back surface facing the active surface, forming a first shield layer on the active surface excluding the electrode terminals, grinding the back surface of the wafer; cutting the wafer including the first shield layer, and sectioning off each of the semiconductor chips having a first shield pattern formed on the active surface, bonding the semiconductor chips to a carrier so that back sides and sides of the semiconductor chips are exposed, forming a second shield layer on the back surface and sides of the semiconductor chips and an upper surface of the carrier, forming a molding layer on an upper surface of the second shield layer, and removing the carrier.

The forming of the first shield layer may include forming mask patterns having a wider area than the electrode terminals and covering the electrode terminals, conformally forming a first shield layer on a surface of a protective layer which is not covered by the mask patterns and surfaces of the mask patterns, and holding the first shield layer only on the surface of the protective layer by removing the mask patterns.

The method may further include forming an interlayer insulating layer covering the first shield layer and exposing the electrode terminals.

The method may further include forming a rewiring unit including vias connected to the electrode terminals, signal wirings connected to the vias, and lands connected to the signal wiring and formed in a direction from an edge of the substrate to the outside.

The method may further include cutting the molding layer, the second shield layer, and the rewiring unit between the semiconductor chips, and sectioning off a single semiconductor package so that a second shield pattern covering the back surfaces and sides of the semiconductor chips and a molding covering the second shield pattern are provided.

In accordance with at least one example embodiment, a method of manufacturing a magnetically shielded semiconductor package includes forming one or more fissures in a lattice structure of a wafer on an active surface thereof, thinning the wafer, forming a layer at the active surface of the wafer, sectioning the wafer on the layer into a plurality of sections, each section corresponding to a semiconductor chip, forming a first shield layer on surfaces of the semiconductor chips and the layer, sectioning off each of the semiconductor chips, each semiconductor chip having an active surface and a first shield pattern on a back surface and sides thereof, bonding one or more of the semiconductor chips to a substrate, and forming a second shield pattern on the active surface of each of the one or more semiconductor chips.

BRIEF DESCRIPTION OF THE DRAWINGS

The foregoing and other example features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 7A to 7C are cross-sectional views taken along line I-I' of FIGS. 6A to 6C, and FIGS. 7D to 7G are cross-sectional views taken along line II-II' of FIGS. 6D to 6G;

DETAILED DESCRIPTION OF THE EMBODIMENTS

Figure 1A:
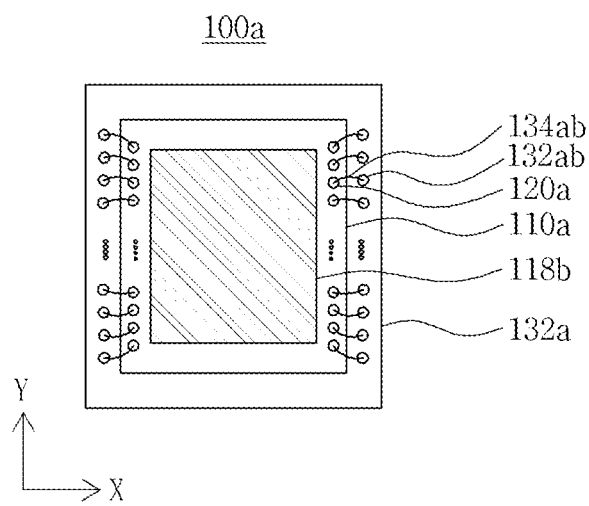
FIG. 1A is a planar view illustrating a semiconductor package according to at least one example embodiment of the inventive concepts.

Various example embodiments will now be described more fully with reference to the accompanying drawings. These inventive concepts may, however, be embodied in different forms and should not be construed as limited to the example embodiments set forth herein. Although a few example embodiments of the inventive concepts have been shown and described, it would be appreciated by those of ordinary skill in the art that changes may be made in these example embodiments without departing from the principles and spirit of the inventive concepts, the scope of which is defined in the claims and their equivalents.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the drawing figures, the dimensions of layers and regions may be exaggerated for clarity of illustration. The same reference numbers indicate the same components throughout the specification. Like numerals refer to like elements throughout. As used herein, the term "and/or" includes any and all combinations of one or more of the associated listed items.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Like reference marks refer to like reference elements throughout. Accordingly, even though the like reference marks or similar reference marks are not referred or explained in the corresponding drawings or figures, the like reference marks or similar reference marks may be explained with reference to other drawings or figures. Further, even though the reference marks are not marked, the reference marks may be explained with reference to other drawings or figures.

Figure 1B:
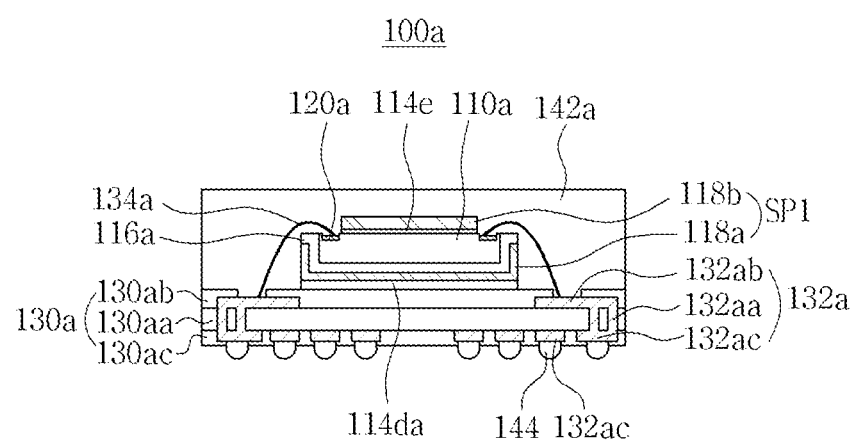
FIG. 1B is a cross-sectional view taken along the X direction of FIG. 1A.

FIG. 1A is a planar view illustrating a semiconductor package according to at least one example embodiment of the inventive concepts, and FIG. 1B is a cross-sectional view taken along the X direction of FIG. 1A.

Referring to FIGS. 1A and 1B, a semiconductor package 100a according to at least one example embodiment of the inventive concepts may include a substrate 130a, a semiconductor chip 110a, a magnetic shield unit SP1, a bonding wire 134a, and a molding 142a.

The substrate 130a may include a printed circuit board (PCB). The PCB may include a base substrate 130aa, a signal wiring unit 132a formed on upper and lower surfaces of the base substrate 130aa, and upper and lower insulating layers 130ab and 130ac covering the signal wiring unit 132a of the upper and lower surfaces of the base substrate 130aa, respectively.

The signal wiring unit 132a may include vias 132aa penetrating the base substrate 130aa and transmitting signals, bonding pads 132ab formed on the base substrate 130aa, and lands 132ac formed on the lower surface of the base substrate 130aa. Upper surfaces of the bonding pads 132ab may be exposed, and lower surfaces of the lands 132ac may be exposed.

The semiconductor chip 110a may be a memory chip including magnetoresistive random access memory devices (MRAMs). The semiconductor chip 110a may include electrode terminals 120a connected to the MRAMs. The semiconductor chip 110a may be configured such that an active surface in which the electrode terminals 120a are formed faces upward. As illustrated in FIG. 1A, the electrode terminals 120a may be located on edges of the semiconductor chip 110a.

The semiconductor chip 110a may be bonded to the upper surface of the substrate 130a by a first bonding layer 114da. The first bonding layer 114da may be a double-sided tape.

The magnetic shield unit SP1 may include a first shield pattern 118a and a second shield pattern 118b. The first shield pattern 118a may cover a lower surface and sides of the semiconductor chip 110a. The second shield pattern 118b may be formed on an upper surface (the active surface) of the semiconductor chip 110a. The second shield pattern 118b may be formed on an area excluding areas on which the electrode terminals 120a are formed.

The first shield pattern 118a may be formed by a physical vapor deposition (PVD) method including sputtering. The second shield pattern 118b may be prepared in the form of a thin film which is previously manufactured. The second shield pattern 118b may be bonded to the upper surface of the semiconductor chip 110a by a second bonding layer 114e. The second bonding layer 114e may have, for example, a liquid form, and may be brushed and in adhesion to the surface of the semiconductor chip 110a.

The magnetic shield unit SP1 may include permalloy. The permalloy may be a soft magnetic alloy containing iron (Fe) and nickel (Ni). The permalloy may have considerably high permeability and may thus be easily capable of penetrating a magnetic field. When a wall formed of permalloy is made, an external magnetic field may be absorbed without penetrating the wall. Further, the permalloy may be easily processed.

The molding 142a may cover the semiconductor chip 110a. The molding 142a may include epoxy molding compound (EMC).

The bonding wire 134a may physically and electronically connect the semiconductor chip 110a and the substrate 130a. Specifically, one end of the bonding wire 134a may be bonded to the electrode terminal 120a of the semiconductor chip 110a, and the other end of the bonding wire 134a may be bonded to the bonding pad 132ab of the substrate 130a. The bonding wire 134a may include gold (Au) or aluminum (Al).

The semiconductor package 100a according to one example embodiment of the inventive concepts may further include solder balls 144 bonded to the lands 132ac of the substrate 130a.

As described above, the semiconductor package 100a according to one example embodiment of the inventive concepts may include a magnetic shield unit SP1 covering the lower surface, sides, and upper surface of the semiconductor chip 110a. The magnetic shield unit SP1 may effectively shield an influx of external magnetic field to the semiconductor chip 110a. Accordingly, stable operations of the MRAMs formed in the semiconductor chip 110a can be substantially ensured or secured.

Figure 2:
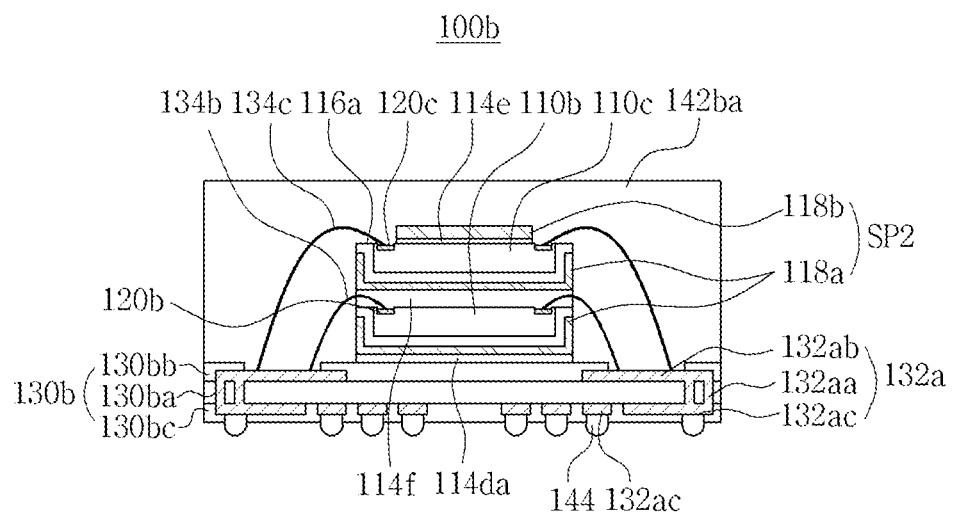
FIG. 2 is a cross-sectional view illustrating a semiconductor package according to another example embodiment of the inventive concepts.

FIG. 2 is a cross-sectional view illustrating a semiconductor package according to another example embodiment of the inventive concepts. Since a semiconductor package 100b according to another example embodiment of the inventive concepts has a construction where the semiconductor chips described above are stacked, a detailed description thereof will be omitted.

Referring to FIG. 2, the semiconductor package 100b according to another example embodiment of the inventive concepts may include a substrate 130b, stacked semiconductor chips 110b and 110c, a magnetic shield unit SP2, bonding wires 134c and 130b, and a molding 142ba.

The substrate 130b may be a PCB. The PCB may include a base substrate 130ba, a signal wiring unit 132a formed on upper and lower surfaces of the base substrate 130ba, and upper and lower insulating layers 130bb and 130bc covering the signal wiring unit 132a at the upper and lower surfaces of the base substrate 130ba, respectively.

The semiconductor chips 110b and 110c may be sequentially stacked first and second semiconductor chips 110b and 110c on the substrate 130b. The first and second semiconductor chips 110b and 110c may be memory chips including MRAMs. The number of the stacked semiconductor chips may not be limited to two.

The first semiconductor chip 110b may include first electrode terminals 120b exposed through an active surface, and the second semiconductor chip 110c may include second electrode terminals 120c exposed through the active surface.

The magnetic shield unit SP2 may include first shield patterns 118a and second shield patterns 118b. The first shield patterns 118a may cover lower surfaces and sides of the first and second semiconductor chip 110b and 110c, respectively. The second shield pattern 118a may cover the upper surface of the second semiconductor chip 110b. The second shield pattern 118b may cover the surface of the second semiconductor chip 110c excluding an area in which the second electrode terminals 120c are formed as shown in FIG. 1A.

The bonding wires 134b and 134c may be a first bonding wire 134b and a second bonding wire 134c. The first bonding wire 134b may be bonded to the first electrode terminal 120b and the bonding pad 132ab of the substrate 130b. The second bonding wire 134c may be bonded to the second electrode terminal 120c and the bonding pad 132ab of the substrate 130b.

The semiconductor package 100b according to another example embodiment of the inventive concepts may further include an inter chip bonding layer 114f compared to the semiconductor package 100a of FIG. 1. The inter chip bonding layer 114f may be used to stack the first semiconductor chip 110b and the second semiconductor chip 110c on one another. Since the inter chip bonding layer 114f holds ends of the first bonding wires 134b connected to the first semiconductor chip 110b, breakage of the first bonding wires can be reduced or prevented. The inter chip bonding layer 114f may include epoxy resin-based adhesive or silicon-based adhesive capable of coating in a liquid or paste form.

In the above example structure, the second shield pattern 118b may be bonded to the upper surface of the semiconductor chip 110c which is located in the uppermost layer regardless of the number of the stacked semiconductor chips 110b and 110c.

An effect of a magnetic field capable of occurring between the semiconductor chips 110b and 110c stacked up and down can be shielded by the second shield pattern 118b formed on the lower surface and the sides of the second semiconductor chip 110c. Accordingly, even when the semiconductor chips (memory chips) are stacked, the magnetic field can be shielded from each other by the magnetic shield unit SP2.

A stack-type semiconductor package according to another example embodiment including the semiconductor package in which a magnetic shield unit (the first shield pattern and the second field pattern) described above is formed will be described below with reference to accompanying drawings.

Figure 3:
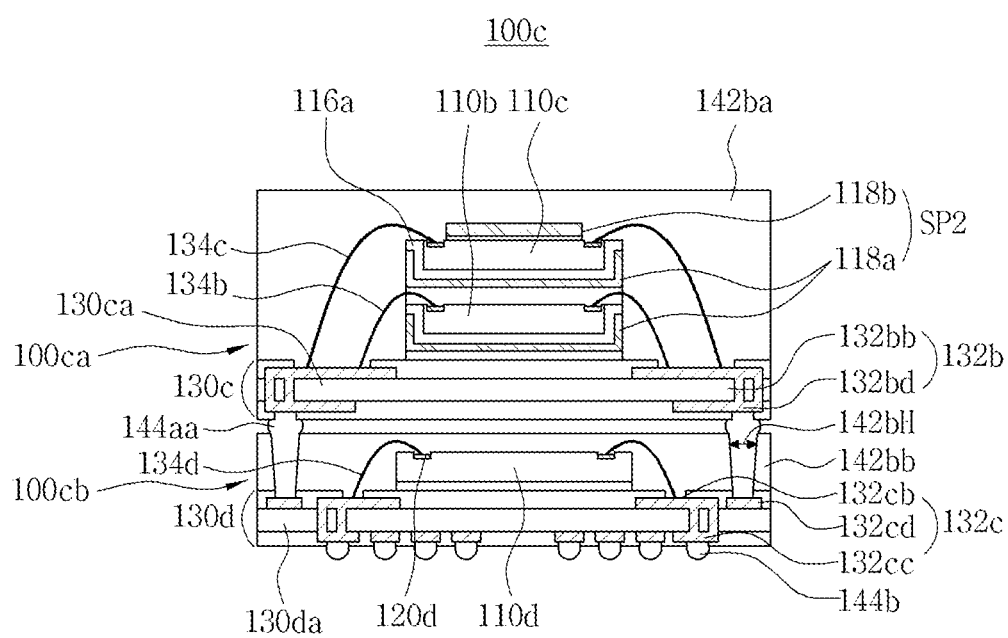
FIG. 3 is a cross-sectional view illustrating a stack-type semiconductor package according to at least one example embodiment of the inventive concepts.

FIG. 3 is a cross-sectional view illustrating a stack-type semiconductor package according to another example embodiment of the inventive concepts.

Referring to FIG. 3, a semiconductor package 100c according to another example embodiment of the inventive concepts may have a structure in which semiconductor packages 100ca and 100cb are stacked.

For example, the semiconductor package 100c according to another example embodiment of the inventive concepts includes a first semiconductor package 110ca, a second semiconductor package 110cb, and a package connection bump 144aa.

The first semiconductor package 100ca may include a first substrate 130c, a first semiconductor chip 110b stacked on the first substrate 130c, a magnetic shield unit SP2, bonding wires 134b and 134c, and a first molding 142ba.

The first substrate 130c may include a first base substrate 130ca, and a first signal wiring unit 132b formed on upper and lower surfaces of the first base substrate 103ca. The first signal wiring unit 132b may include a first bonding pad 132bb formed on the upper surface of the first base substrate 130ca, and a first bump land 132bd formed on a lower surface of the first base substrate 130ca.

The first and second semiconductor chips 110b and 110c may be memory chips including MRAMs.

The magnetic shield unit SP2 may include first shield patterns 118a covering lower surfaces and sides of the first and second semiconductor chips 110b and 110c, and a second shield pattern 118b formed on an upper surface of the semiconductor chip 110c which is located on the uppermost layer.

The bonding wires 134b and 134c may include a first bonding wire 134b and a second bonding wire 134c. The first bonding wire 134b may be bonded to the first semiconductor chip 110b and the substrate 130c, and the second bonding wire 134c may be bonded to the second semiconductor chip 110c and the substrate 130c.

The second semiconductor package 100cb may include a second substrate 130d, a third semiconductor chip 110d, a third bonding wire 134d, and a second molding 142bb.

The second substrate 130d may include a second base substrate 130da, and a second signal wiring unit 132c formed on upper and lower surfaces of the second base substrate 130da.

The second signal wiring unit 132c may include a second bonding pad 132cb and a second bump land 132cd formed on an upper surface of the second base substrate 130da, and lands 132cc formed at a lower surface of the second base substrate 130da.

The third semiconductor chip 110d may be a logic semiconductor chip. The third semiconductor chip 110d may be formed such that an active surface thereof faces upward.

Third electrode terminals 120*d*, which may be electrode terminals of logic elements, may be formed in the active surface.

One end of the third bonding wire 134*d* may be bonded to the third electrode terminal 120*d* of the third semiconductor chip 110*d*, and the other end of the third bonding wire 134*d* may be bonded to the second bonding pad 132*cb* of the substrate 130*d*.

The second molding 142*bb* may include a through hole 142*b*H formed to be correspond to the second bump land 132*cd*. A bottom surface of the through hole 142*b*H may be an upper surface of the second bump land 132*cd*.

The second semiconductor package 130*cb* may further include solder balls 144*b* which are in contact with lower surfaces of the lands 132*cc*.

The first and second semiconductor packages 100*ca* and 100*cb* may be physically and electrically connected through a package connection bump 144*aa*.

The package connection bump 144*aa* may fill the through hole 142*b*H of the second molding 142*bb*. The package connection bump 144*aa* may be bonded to the first bump land 132*bd* of the first semiconductor package 100*ca* and the second bump land 132*cd* of the second semiconductor package 100*cb*.

The stack-type semiconductor package 100*c* according to another example embodiment of the inventive concepts may have a structure that every surface of the first and second semiconductor chips 110*b* and 110*c* including the MRAMs is covered by the magnetic shield unit SP2 (the first shield patterns 118*a* and the second shield pattern 118*b*). An influx of an external magnetic field to the first and second semiconductor packages 110*b* and 110*c* may be effectively shielded by the magnetic shield unit SP2.

Accordingly, a stable operation of the stack-type semiconductor package according to another example embodiment of the inventive concepts can be secured.

Figure 4:
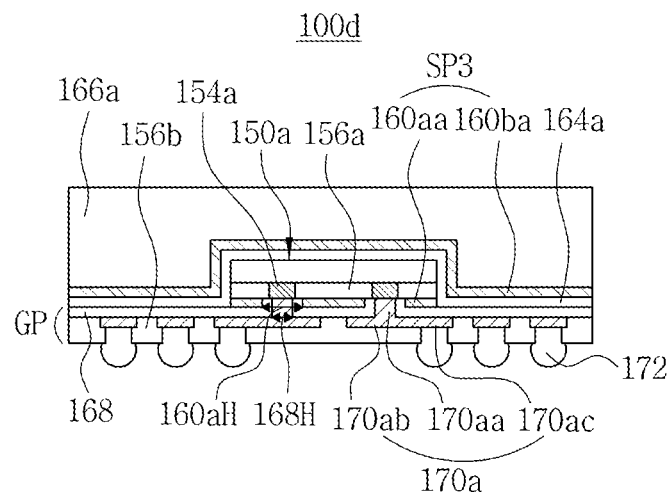
FIG. 4 is a cross-sectional view illustrating a semiconductor package according to at least one example embodiment of the inventive concepts.

FIG. 4 is a cross-sectional view illustrating a semiconductor package according to another example embodiment of the inventive concepts.

Referring to FIG. 4, a semiconductor package 100*d* according to another example embodiment of the inventive concepts includes a semiconductor chip 150*a*, a semiconductor chip support unit GP, a magnetic shield unit SP3, and a molding 166*a*.

The semiconductor chip 150*a* may be a memory chip including MRAMs. The semiconductor chip 150*a* may include electrode terminals 154*a* connected to the MRAMs, and a first protective layer 156*a* surrounding the electrode terminals 154*a*.

The semiconductor chip support unit GP may include an interlayer insulating layer 168, a rewiring unit 170*a*, and a second protective layer 156*b*, which are sequentially stacked.

The rewiring unit 170*a* may include vias 170*aa* which penetrates the interlayer insulating layer 168 and is physically or electrically connected to the semiconductor chip 150*a*, signal wirings 170*ab* connected to the vias 170*aa*, and lands 170*ac* connected to one end of the signal wirings 170*ab*. The lands 170*ac* may be formed in the direction from edges of the semiconductor chip 150*a* to edges of the semiconductor package 100*d*. The interlayer insulating layer 168 and the rewiring unit 170*a* may alternately be formed in a multi-layer.

The semiconductor chip support unit GP may be stacked on a lower surface of the semiconductor chip 150*a*. Specifically, the lower surface (an active surface) of the semiconductor chip 150*a* may face one surface of the interlayer insulating layer 168. The electrode terminals 154*a* of the semiconductor chip 150*a* may be physically or electrically connected to the vias 170*aa* of the rewiring unit 170*a*.

The magnetic shield unit SP3 may include a first shield pattern 160*aa* and a second shield pattern 160*ba*. The first shield pattern 160*aa* may be formed on a lower surface of the active surface of the semiconductor chip 150*a*. The first shield pattern 160*aa* may be formed on a lower surface of the first protective layer 156*a*. The first shield pattern 160*aa* may include first through holes 160*a*H for exposing surfaces of the electrode terminals 154*a*. The first through hole 160*a*H may have a greater area than the electrode terminal 154*a*.

A lower surface of the first shield pattern 160*aa* may be in contact with the interlayer insulating layer 168. The interlayer insulating layer 168 may include a second through hole 168H. The second through hole 168H may have a smaller area than the electrode terminal 154*a*. Accordingly, the interlayer insulating layer 168 may cover an upper surface and sides of the first shield pattern 166*aa*.

The second shield pattern 160*ba* may cover the upper surface and sides of the semiconductor chip 150*a*, and may extend to an upper surface of the semiconductor chip support unit GP on which the semiconductor chip 150*a* is not located.

The first shield pattern 160*aa* and the second shield pattern 160*ba* may be formed through a PVD process including a sputter.

The molding 166*a* may be in contact with an upper surface of the second shield pattern 166*bb*. The molding 166*a* may include EMC.

The semiconductor package 100*d* according to another example embodiment of the inventive concepts may further include a buffer pattern 164*a* formed between the second shield pattern 160*ba*, and the semiconductor chip 150*a* and the semiconductor chip support unit GP. The buffer pattern 164*a* may include a silicon oxide and a silicon nitride.

The semiconductor package 100*d* according to another example embodiment of the inventive concepts may include solder balls 172 which penetrate the second protective layer 156*d* and are in contact with the lands 170*ac*.

As described above, the semiconductor package 100*d* according to another example embodiment of the inventive concepts may include a structure that does not use an additional substrate and rearranges a signal wiring to the outside through a rewiring process in a wafer level. Accordingly, a size of the semiconductor package can be minimized, a package process can be simplified, and a yield can be improved.

The semiconductor package 100*d* according to another example embodiment of the inventive concepts may include a magnetic shield unit SP3 covering an entire surface of the semiconductor chip 150*a*. An influx of an external magnetic field to the semiconductor chip 150*a* can be effectively shielded by the magnetic shield unit SP3. Accordingly, stable operations of the MRAMs included in the semiconductor chip 150*a* can be secured.

Hereinafter, a stack-type semiconductor package according to another example embodiment of the inventive concepts including the semiconductor package in which the magnetic shield unit is formed as described above will be described with reference to accompanying drawings.

Figure 5:
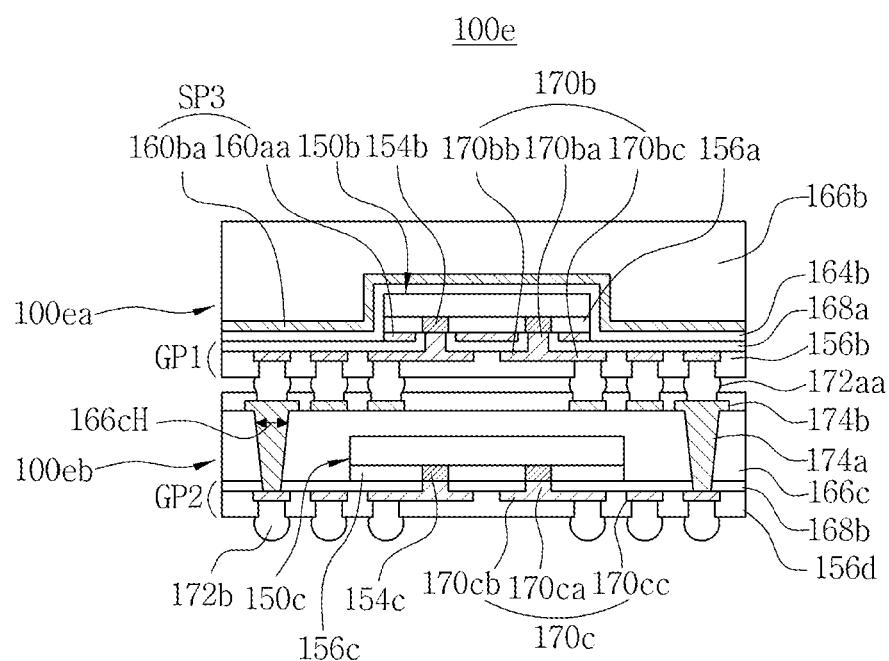
FIG. 5 is a cross-sectional view illustrating a stack-type semiconductor package according to at least one example embodiment of the inventive concepts.

FIG. 5 is a cross-sectional view illustrating a stack-type semiconductor package according to another example embodiment of the inventive concepts.

Referring to FIG. 5, a stack-type semiconductor package 100*e* according to another example embodiment of the inventive concepts may have a structure that semiconductor packages 100*ea* and 100*eb* are stacked.

For example, the stack-type semiconductor package 100*e* according to another example embodiment of the inventive concepts may include a first semiconductor package 100ea, a second semiconductor package 100eb, and package connection bumps 172aa.

The first semiconductor package 100ea may include a first semiconductor chip 150b, a first semiconductor chip support unit GP1, a magnetic shield unit SP3, and a first molding 166b.

The first semiconductor chip 150b may be a memory chip including MRAMs. The first semiconductor chip 150b may include a first electrode terminal 154b formed at an active surface, and a first protective layer 156a surrounding the first electrode terminal 154b.

The first semiconductor support unit GP1 may include a first interlayer insulating layer 168a, a first rewiring unit 170b, and a second protective layer 156b. The first rewiring unit 170b may include first vias 170ba, first signal wirings 170bb, and first bump lands 170bc.

The second semiconductor package 100eb may include a second semiconductor chip 150c, a second semiconductor chip support unit GP2, land connection bumps 174a, second bump lands 174b, and a second molding 166c.

The second semiconductor chip 150c may be a logic chip. The second semiconductor chip 150c may include second electrode terminals 154c formed on an active surface, and a third protective layer 156c surrounding the second electrode terminal 154c.

The second semiconductor chip 150c may be formed such that the second electrode terminals 154c of logic elements face the second semiconductor chip support unit GP2.

The second semiconductor chip support unit GP2 may include a second interlayer insulating layer 168b, second rewiring units 170c, and a fourth protective layer 156d which are sequentially stacked.

The second rewiring unit 170c may include second vias 170ca which penetrate the second interlayer insulating layer 168b and are physically and electrically connected to the second semiconductor chip 150c, second signal wirings 170cb connected to the second vias 170ca, and lands 170cc connected to ends of the second signal wirings 170cb. The lands 170cc may be formed in the direction from edges of the second semiconductor chip 150c to edges of the second semiconductor package 100eb. The second interlayer insulating layer 168b and the second rewiring units 170c may be alternately formed in a multi-layer.

The second semiconductor chip support unit GP2 may be stacked on a lower surface of the second semiconductor chip 150c. Second electrode terminals 154c of the second semiconductor chip 150c may be physically and electrically connected to the vias 170ca of the second wiring units 170c.

The second molding 166c may include EMC. The second semiconductor package 100e may include a through hole 166cH which penetrates the second molding 166c. The through hole 166cH may be formed on an upper surface of the lands 170cc disposed adjacent to the edge of the second semiconductor package 100e. A bottom surface of the through hole 166cH may be an upper surface of the lands 170cc.

The land connection bump 174a may be in contact with the lands 170cc, and fill the through hole 166cH.

The second bump lands 174b may be formed on a surface of an upper surface of the second molding 166c which face the lands 170cc. Accordingly, the land connection bump 174a may be physically and electrically connected to the lands 170cc and the second bump lands 174b.

The first and second semiconductor packages 100ea and 100eb may be physically and electrically connected through the package connection bump 172aa.

The package connection bump 172aa may be bonded to the first bump lands 170bc of the first semiconductor package 100ea and the second bump lands 174b of the second semiconductor package 100eb.

Figure 6A:
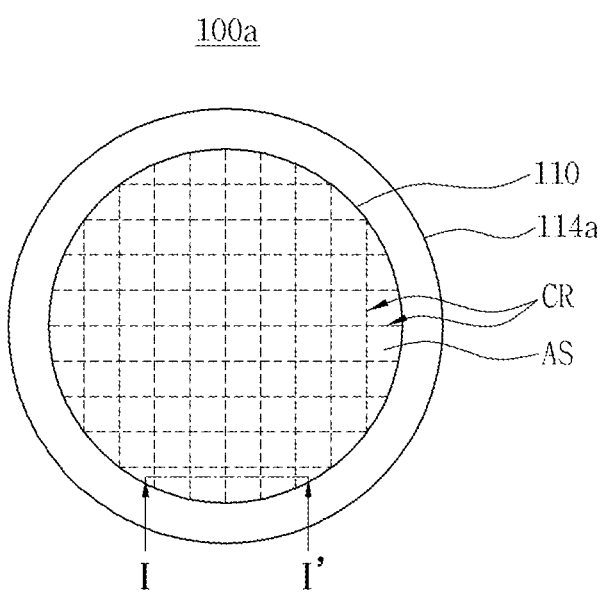
FIGS. 6A to 6G, and 7A to 7L are schematic layouts and cross-sectional views illustrating a method of packaging a memory semiconductor device in process sequence according to at least one example embodiment of the inventive concepts.
Figure 6B:
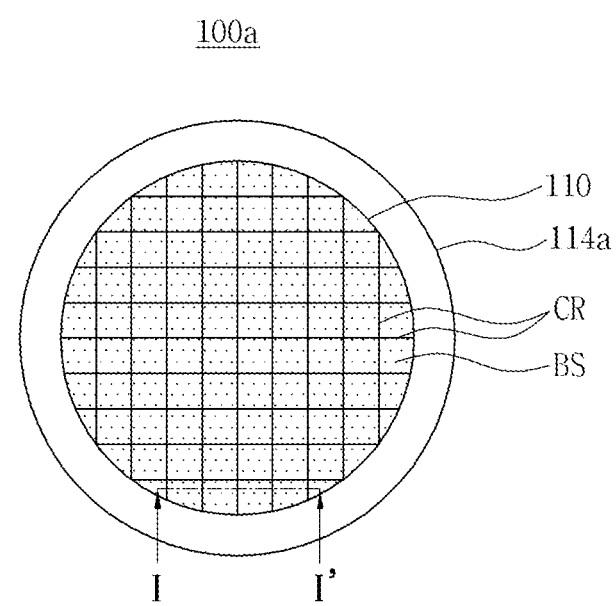
Figure 6C:
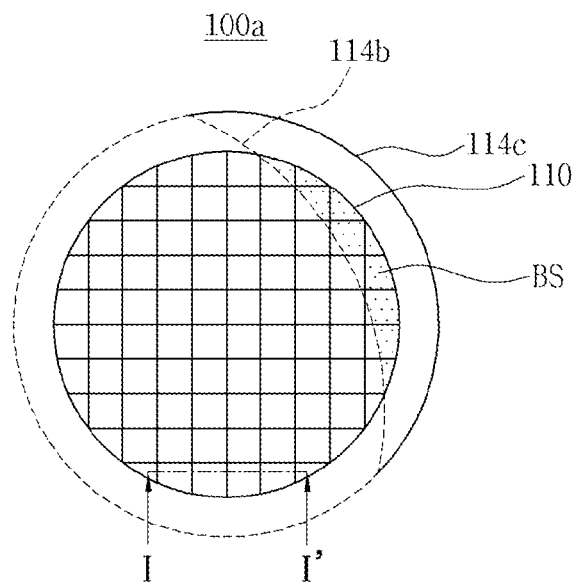
Figure 6D:
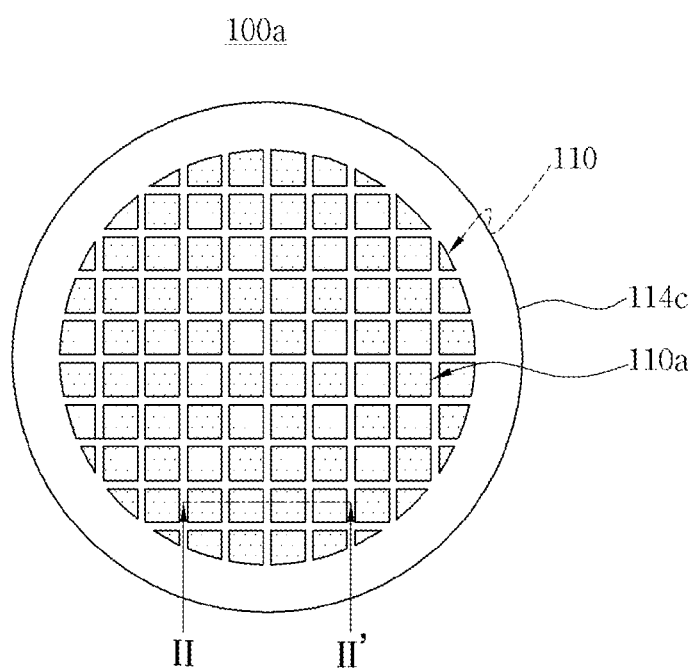
Figure 6E:
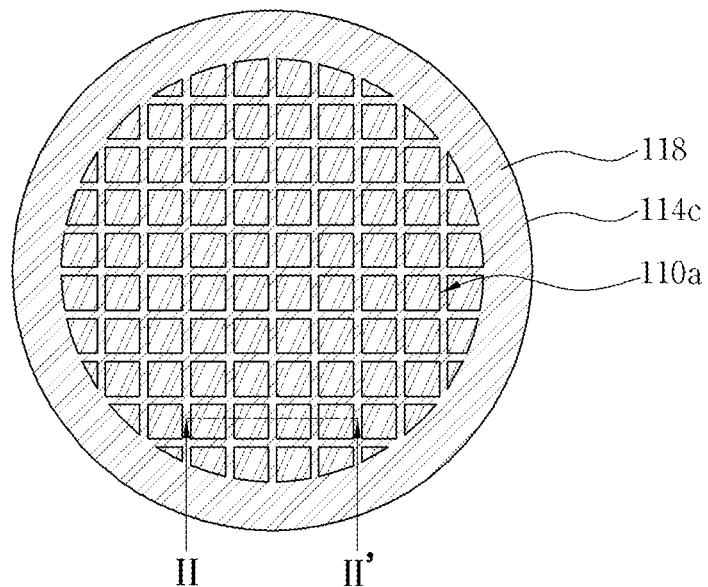
Figure 6F:
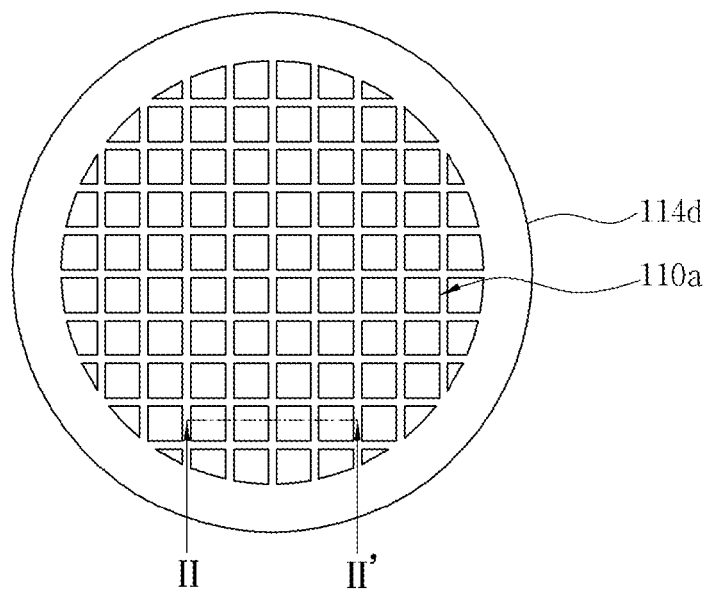
Figure 6G:
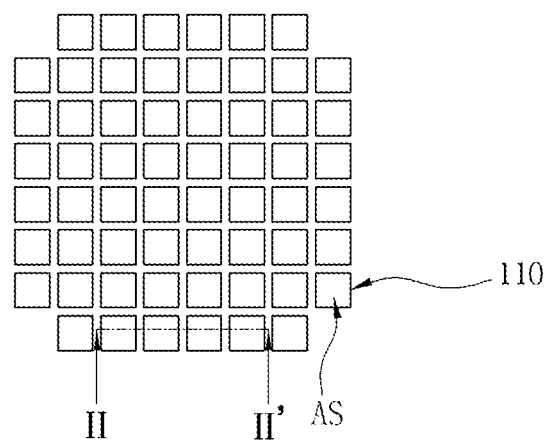
Figure 7A:
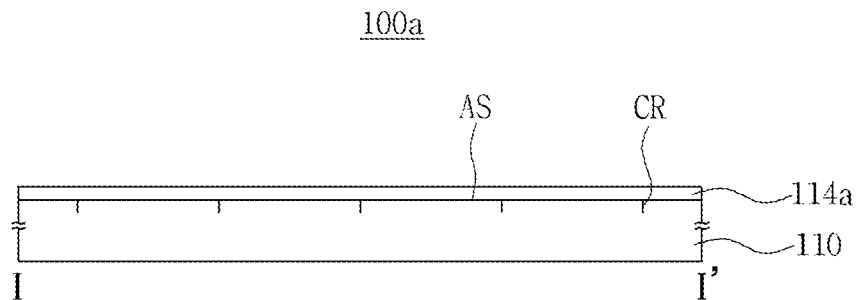
Figure 7B:
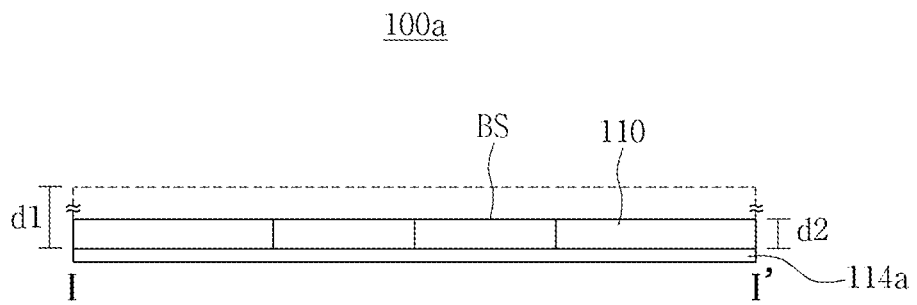
Figure 7C:
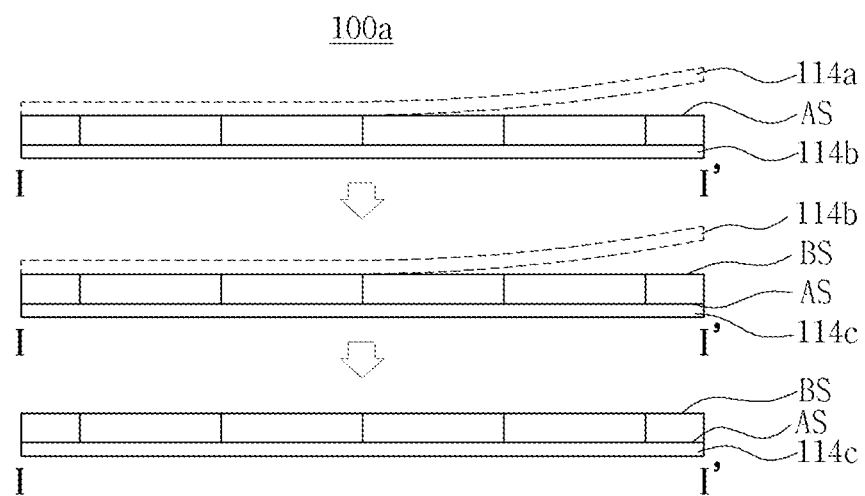

FIGS. 6A to 6G, and 7A to 7I are schematic layouts and cross-sectional views illustrating a method of packaging a memory semiconductor device in process sequence according to at least one example embodiment of the inventive concepts, and FIGS. 7A to 7C are cross-sectional views taken along line I-I' of FIGS. 6A to 6C, and FIGS. 7D to 7G are cross-sectional views taken along line II-II' of FIGS. 6D to 6G.

Referring to FIGS. 6A and 7A, a method of manufacturing the semiconductor package 100a according to at least one example embodiment of the inventive concepts may include irradiating an active surface AS of an wafer 110 on which a plurality of MRAMs with a laser beam are formed, and bonding a first tape 114a to the active surface AS.

The active surface AS of the wafer 110 may be an upper surface of areas in which the MRAMs are formed. The irradiating of the laser beam may include irradiating with the laser beam in horizontal and vertical directions in consideration of a desired, or alternatively predetermined chip size to the active surface AS.

The irradiating of the laser beam, as shown in FIG. 7A, may include a crack or fissure CR which is generated from the active surface AS to a constant depth.

The bonding of the first tape 114a may include bonding a back grinding type tape to the active surface AS on which the laser beam is radiated. The back grinding type tape 114a may prevent the active surface AS of the wafer 110 from being damaged or contaminated by foreign substances. The back grinding type tape 114a may include polyvinyl chloride (PVC).

Referring to FIGS. 6B and 7B, the method of manufacturing the semiconductor package 100a according to at least one example embodiment of the inventive concepts may include grinding a back surface of the wafer 110.

The grinding of the back surface may be grinding the back surface of the wafer 110 in order to make a thickness of the wafer 110 uniform. In this case, the thickness of the wafer 110 may be in a range of 0.2 mm to 0.51 mm.

During grinding of the back surface, as shown in FIG. 7B, the thickness of the wafer 110 may be decreased from a thickness d1 to a thickness d2, and the crack or fissure CR generated by the irradiation of the laser beam, which is a previous process, may extend to the back surface of the ground wafer 110.

Referring to FIGS. 6C and 7C, the method of manufacturing the semiconductor package 100a according to at least one example embodiment of the inventive concepts may include bonding a second tape 114b to the back surface of the wafer 110. A method of the semiconductor package 100a according to an example embodiment of the inventive concepts may include removing the first tape 114a after bonding the second tape 114b.

Further, the method of manufacturing the semiconductor package 100a according to an example embodiment of the inventive concepts, after bonding a third tape 114c to the active surface AS where the first tape 114a was removed, may include exposing the back surface BS of the wafer 110 by removing the second tape 114b.

The second tape 114b and the third tape 114c may be protective tapes. The protective tape may include PVC.

Figure 7D:
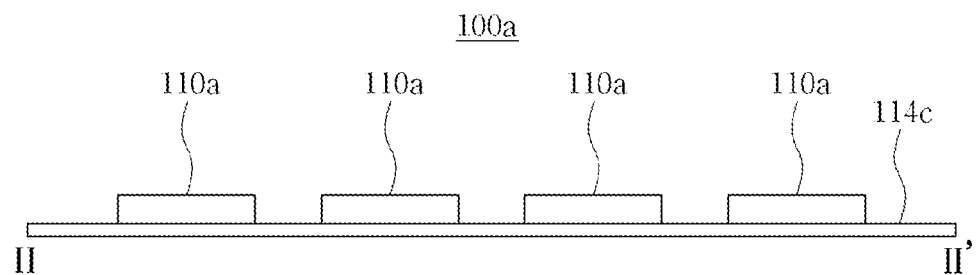

Referring to FIGS. 6D and 7D, the method of manufacturing the semiconductor package 100a according to at least one example embodiment of the inventive concepts may include expanding or elongating the third tape 114c such that the wafer 110 on the third tape 114c shown in FIGS. 6C and 7C is divided as semiconductor chips 110a.

The expanding of the third tape 114c may include pulling edges of the third tape 114c with a constant strength in a direction parallel to the active surface AS.

While the third tape 114c is expanded in all directions, the wafer 110 may be divided into the semiconductor chips 110a by the cracks CR, which are expanded to the back surface BS of the wafer 110. The semiconductor chips 110a may be aligned with a constant distance therebetween by the expanded third tape 114c.

Figure 7E:
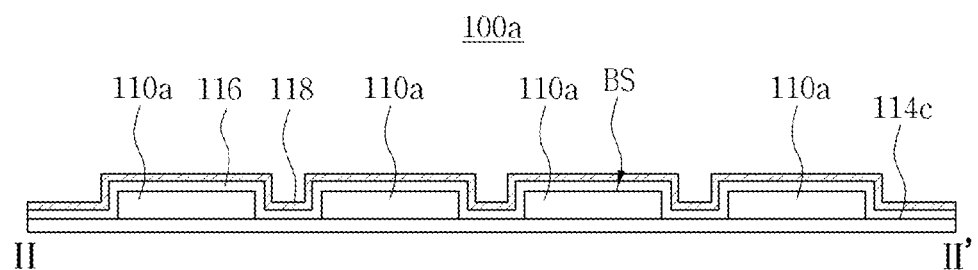

Referring to FIGS. 6E and 7E, the method of manufacturing the semiconductor package 100a according to at least one example embodiment of the inventive concepts may include stacking a buffer layer 116 and a shield layer 118 on the semiconductor chips 110a bonded to the third tape 114c.

The buffer layer 116, as shown in FIG. 7E, may be formed on the exposed back surfaces BS and sides of the semiconductor chips 110a, and on an exposed upper surface of the third tape 114c between the semiconductor chips 110a.

The buffer layer 116 may include an insulating layer. The insulating layer may include the silicon oxide ($SiO_2$) and the silicon nitride ($SiN_x$).

The shield layer 118 may include a material with high permeability. The shield layer 118 may include permalloy. The permalloy may be a soft magnetic alloy containing Fe and Ni. The permalloy may have considerably high permeability and characteristics of easily penetrating a magnetic field. When a wall is formed of the permalloy, an external magnetic field may be absorbed in and not penetrate the wall. Further, the permalloy may be easily processed.

The method of forming the permalloy may include the PVC process including a sputter.

Figure 7F:
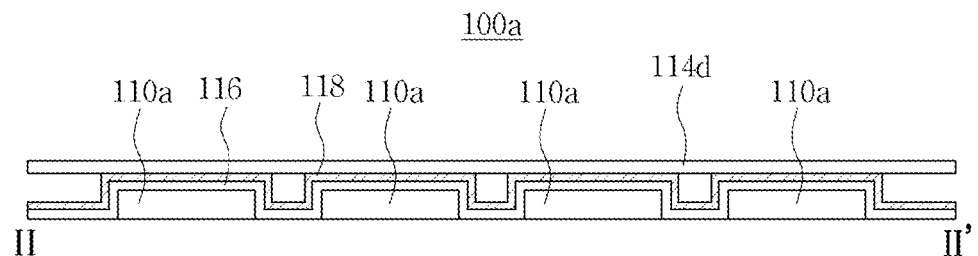

Referring to FIGS. 6F and 7F, the method of manufacturing the semiconductor package 100a according to at least one example embodiment of the inventive concepts may include bonding a fourth tape 114d to a surface of the shield layer 118. The fourth tape 114d may be a double-sided bonding tape. The double-sided bonding tape may be a die attached film (DAF) used in a semiconductor package process.

Figure 7G:
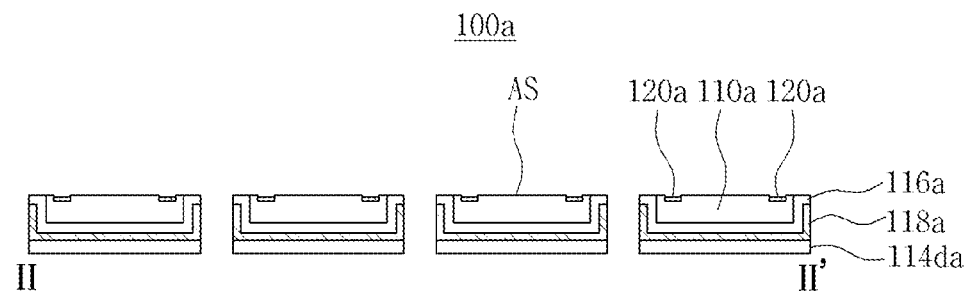

Referring to FIGS. 6G and 7G, the method of manufacturing the semiconductor package 100a according to at least one example embodiment of the inventive concepts may include sectioning off each of the semiconductor chips 110a having the buffer layer 116 and the shield layer 118.

The sectioning off of each of the semiconductor chips 110a may include sectioning off each of the semiconductor chips 110a by irradiating the laser beam between the semiconductor chips 110a. While sectioning off each of the semiconductor chips 110a, the buffer layer 116, the shield layer 118, and the fourth tape 114 shown in FIG. 6F are cut.

Accordingly, a buffer pattern 116a, a first shield pattern 118a, and a first bonding layer 114da may be stacked on the back surface BS of the semiconductor chips 110a, and the active surface AS of the semiconductor chips 110a and upper surfaces of the electrode terminals 120a of the MRAMs may be exposed.

Figure 7H:
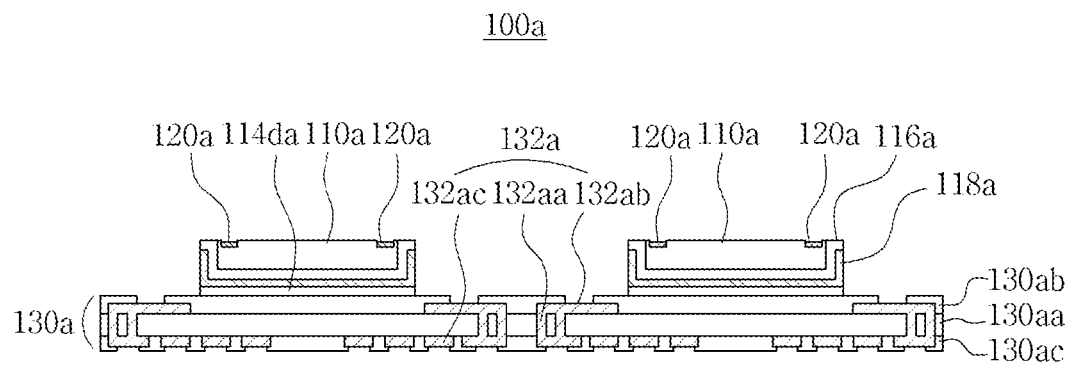

Referring to FIG. 7H, the method of manufacturing the semiconductor package 100a according to at least one example embodiment of the inventive concepts may include bonding the semiconductor chips 110a to a substrate 130a.

The semiconductor chips 110a may be bonded to the substrate 130a through a first bonding layer 114da bonded to the back surface BS of the semiconductor chips 110a.

The substrate 130a may include a printed circuit board (PCB). The PCB may include a base substrate 130aa, a signal wiring unit 132a formed on upper and lower surfaces of the base substrate 130aa, and upper and lower insulating layers 130ab and 130ac covering the signal wiring unit 132a formed on the upper and lower surfaces of the base substrate 130a, respectively.

The signal wiring unit 132a may include vias 132aa for transferring signals through the base substrate 130aa, bonding pads 132ab formed on the base substrate 130aa, and lands 132ac formed on the lower surface of the base substrate 130aa. Upper surfaces of the bonding pads 132ab and lower surfaces of the lands 132ac may be exposed.

Figure 7I:
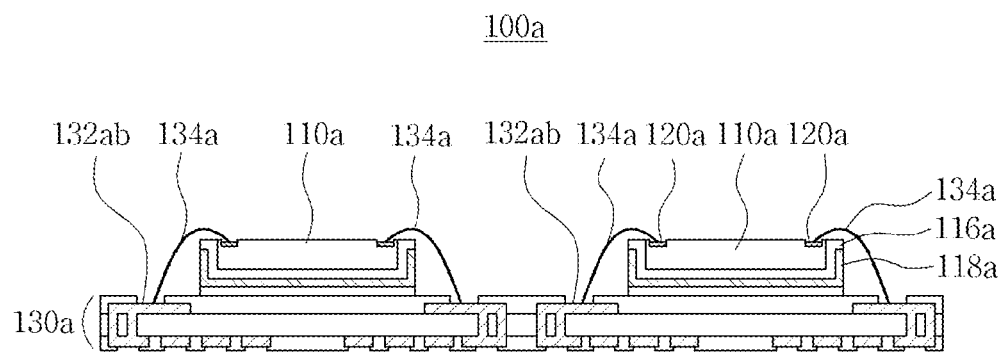

Referring to FIG. 7I, the method of manufacturing the semiconductor package 100a according to at least one example embodiment of the inventive concepts may include adding bonding wires 134a for physically and electrically connecting between the semiconductor chip 110a and the substrate 130a.

The bonding wires 134a may be bonded to the electrode terminals 120a of the semiconductor chips 110a and to the bonding pads 132ab of the substrate 130a.

The bonding wires 134a may include gold (Au) or aluminum (Al).

Figure 7J:
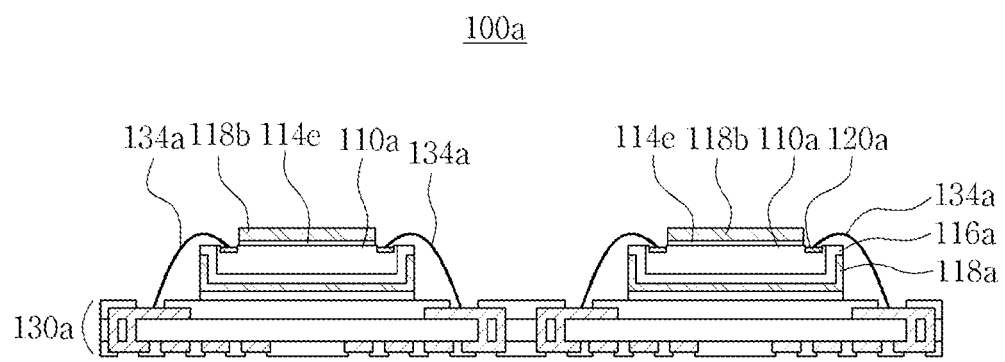

Referring to FIG. 7J, the method of manufacturing the semiconductor package 100a according to at least one example embodiment of the inventive concepts may include bonding a second shield pattern 118b to the upper surface of the semiconductor chip 110a.

The second shield pattern 118b may include a material with high permeability. The second shield pattern 118b may be bonded in the form of a thin film.

The second shield pattern 118b may include permalloy that is an alloy of Fe and Ni.

The second shield pattern 118b may be bonded on the upper surface of the semiconductor chip 110a by a second bonding layer 114e. The second bonding layer 114e may have a liquid form, and may be applied and adhere to the surface of the semiconductor chip 110a.

The second shield pattern 118b may cover the upper surface of the semiconductor chip 110a excluding an area in which the electrode terminals 120a are formed.

Figure 7K:
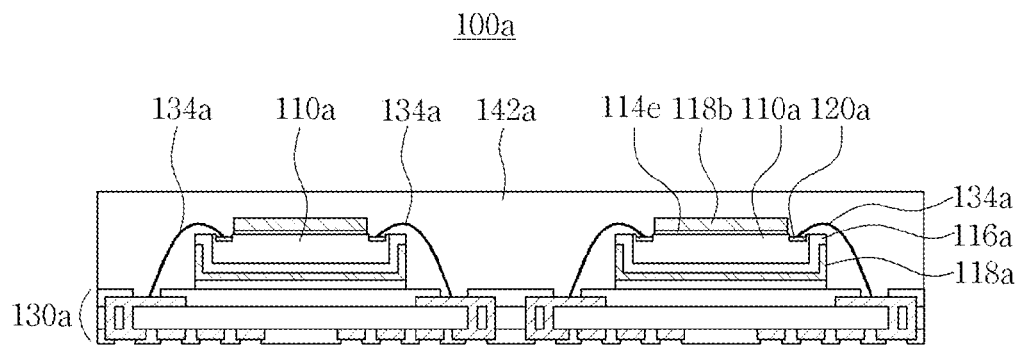

Referring to FIG. 7K, the method of manufacturing the semiconductor package 100a according to at least one example embodiment of the inventive concepts may include forming a molding layer 142a for sealing the semiconductor chips 110a.

The forming of the molding layer 142a may include forming and curing a molding material on an entire surface of the substrate 130a.

The molding layer 142a may protect the semiconductor chip 110a from external shocks and contaminants. The molding layer 142a may include an epoxy molding compound (EMC).

Figure 7L:
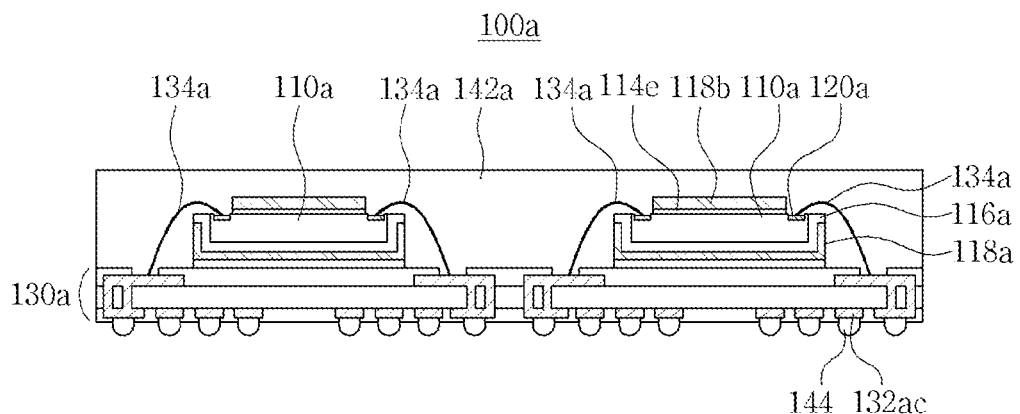
Figure 7L:
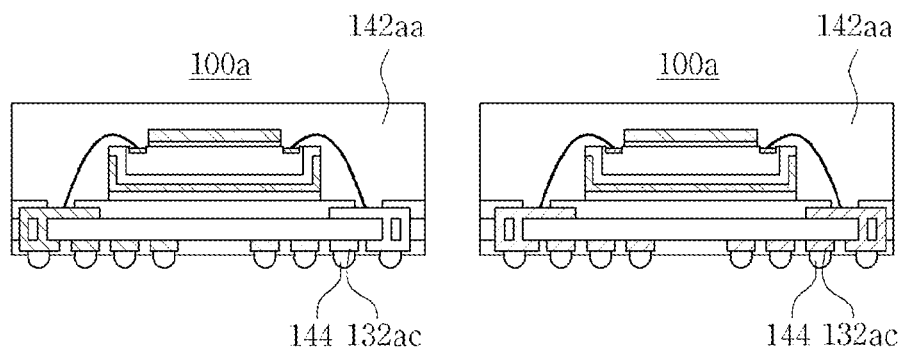

Referring to FIG. 7L, the method of manufacturing the semiconductor package 100a according to at least one example embodiment of the inventive concepts may include forming solder balls 144 on the lower surface of the substrate 130a, and sectioning off a single semiconductor package 100a including each of the semiconductor chips 110a.

The forming of the solder balls 144 may include bonding the solder balls 144 to the lands 132ac of the substrate 130a.

The sectioning off of the single semiconductor package 100a may include simultaneously cutting the substrate 130a and the molding layer 142a. Each sectioned off molding layer 142aa in the single semiconductor package 100a is referred to as a molding 142aa.

The sectioning off of each single semiconductor package 100a may be performed using, for example, a sawing process, a drilling process, and/or a cutting process. Through the sectioning off of each single semiconductor package 100a, the semiconductor package 100a according to one example embodiment of the inventive concepts may be formed.

Hereinafter, a method of manufacturing a semiconductor package 100b according to another example embodiment of the inventive concepts where the semiconductor chips on which the above-mentioned first and second shield patterns 116a and 118a are formed are stacked will be described with reference to accompanying drawings.

FIGS. 8A to 8D are cross-sectional views illustrating a method of manufacturing a semiconductor package in process sequence according to another example embodiment of the inventive concepts.

Since processes prior to processes described below are similar to or the same as to the processes of FIGS. 7A to 7I, a detailed description will be omitted.

Figure 8A:
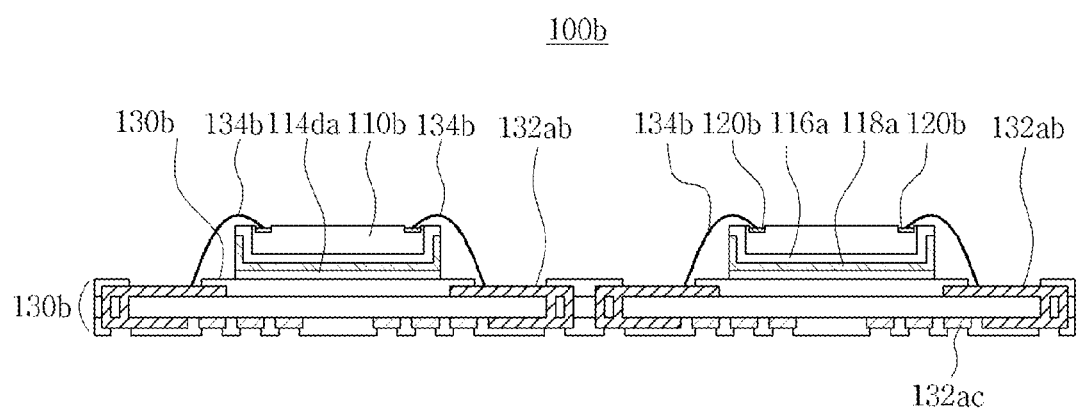
FIGS. 8A to 8D are cross-sectional views illustrating a method of manufacturing a semiconductor package in process sequence according to at least one example embodiment of the inventive concepts.

Referring to FIG. 8A, a method of manufacturing a semiconductor package 100b according to another example embodiment of the inventive concepts may include bonding a first semiconductor chip 110b to a substrate 130b, and bonding a first boding wire 134b between the first semiconductor chip 110b and the substrate 130b.

The first semiconductor chip 110b may be bonded to the substrate 130b through a first bonding layer 114da. The buffer patterns 164a and the first shield pattern 118a formed through the processes of FIGS. 7A to 7E are sequentially stacked on back surface and sides of the semiconductor chip 110b. Accordingly, the first bonding layer 114da may be in contact with the first shield pattern 118a and an upper insulating layer 130ba of the substrate 130b.

The substrate 130b may be a PCB. The substrate 130b may include bonding pads 132ab exposed upward from the substrate 130b, and lands 132ac exposed downward from the substrate 130b. The bonding pads 132ab may have wider exposed areas than the bonding pads 132ab of the semiconductor package 100a described above.

The buffer pattern 116a may include silicon nitride (SiNx) and silicon oxide (SiO$_2$). The first shield pattern 118a may include a material with high permeability. The first shield pattern 118a may include permalloy that is an alloy of Fe and Ni.

The bonding of the first bonding wire 134b may include bonding first electrode terminals 120b of the first semiconductor chip 110b and the bonding pads 132ab.

Figure 8B:
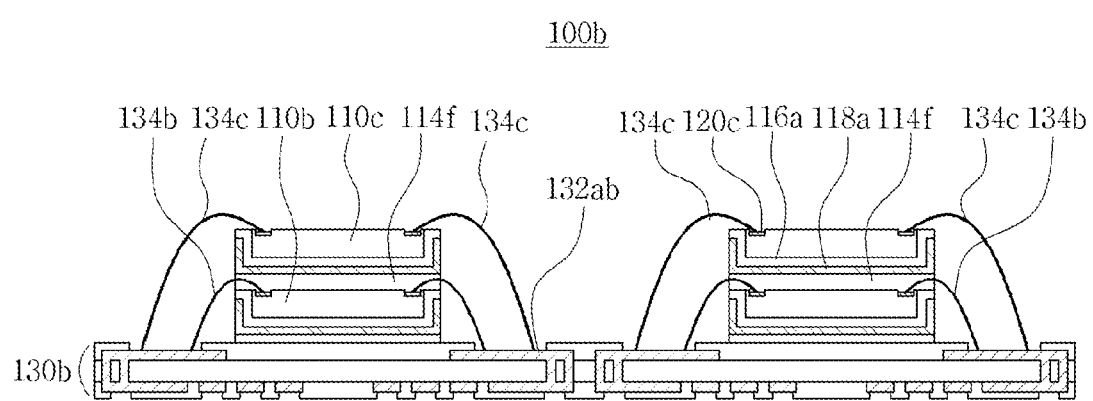

Referring to FIG. 8B, the method of manufacturing a semiconductor package 100b according to another example embodiment of the inventive concepts may include stacking a second semiconductor chip 110c on an upper surface of the first semiconductor chip 110b, and bonding a second bonding wire 134c between the second semiconductor chip 110c and the substrate 130b.

The stacking of the second semiconductor chip 110c may include forming an inter chip bonding layer 114f on the upper surface of the first semiconductor chip 110b to which ends of the first bonding wires 134b are bonded, and bonding the second semiconductor chip 110c on the upper surface of the first semiconductor chip 110b.

A buffer pattern 116a and a first shield pattern 118a may be formed, for example sequentially formed, on a back surface and sides of the second semiconductor chip 110c.

Since the inter chip bonding layer 114f holds one end of the first bonding wire 134b connected to the first electrode terminal 120b of the first semiconductor chip 110b, the inter chip bonding layer 114f may be coated in a liquid or paste form. The inter chip bonding layer 114f may include epoxy resin-based adhesive or silicon-based adhesive.

The bonding of the second bonding wire 134c may include bonding one end of the second bonding wire 134c to the second electrode terminal 120c of the second semiconductor chip 110c, and bonding the other end of the second bonding wire 134c to the bonding pads 132ab of the substrate 130b.

Figure 8C:
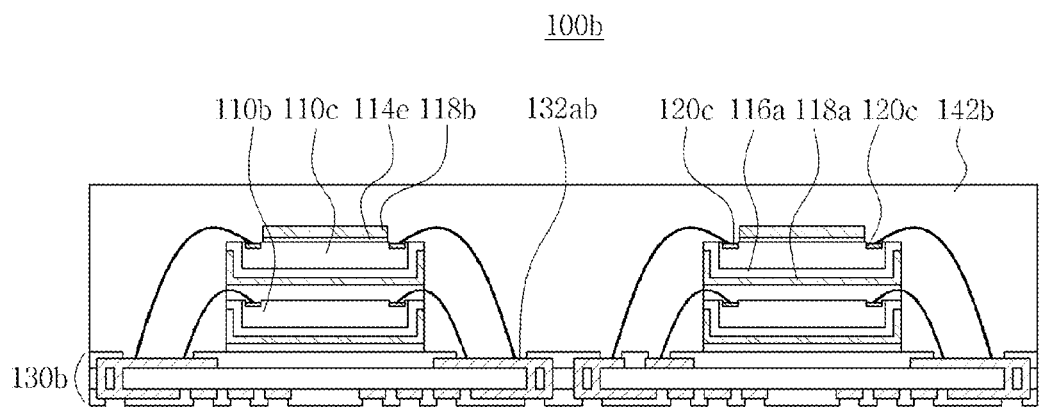

Referring to FIG. 8C, the method of manufacturing a semiconductor package 100b according to another example embodiment of the inventive concepts may include forming the second shield patterns 118b on the upper surfaces of the second semiconductor chip 110c, respectively, and forming the molding layer 142b covering the second shield patterns 118b and the stacked semiconductor chips 110b and 110c.

The second shield patterns 118b may include a material with high permeability. The second shield patterns 118b may include permalloy that is an alloy of Fe and Ni.

The second shield patterns 118b may be previously manufactured in the form of a thin film, and be bonded to the upper surface of the second semiconductor chip 110c through the second bonding layer 114e.

Figure 8D:
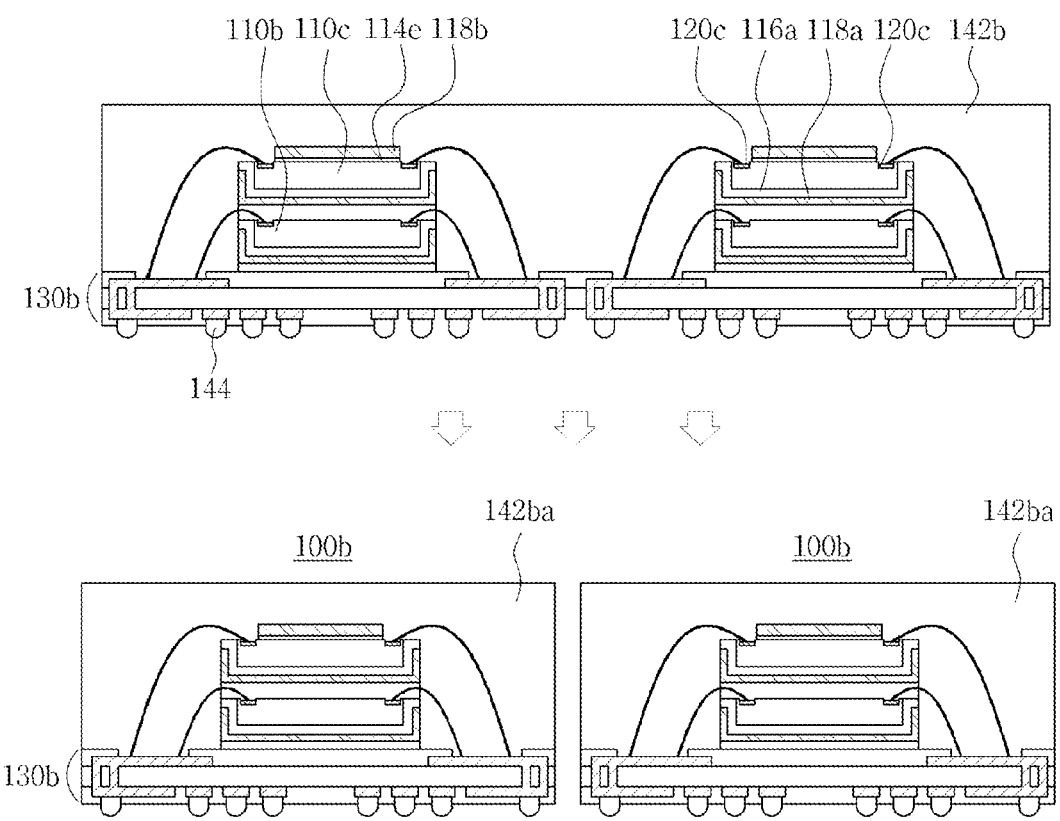

Referring to FIG. 8D, the method of manufacturing a semiconductor package 100b according to another example embodiment of the inventive concepts may include forming solder balls 144 on a lower surface of the substrate 130b, and sectioning off a single semiconductor package 100b including each of the stacked semiconductor chips 110b and 110c.

The forming of the solder balls 144 may include bonding the solder balls 144 to the lands 132ac of the substrate 130b.

The sectioning off of the single semiconductor package 100b may include simultaneously cutting the substrate 130b and the molding layer 142b. Each of the sectioned off molding layer 142ba in the single semiconductor package 100b is referred to as a molding 142ba.

The sectioning off of the single semiconductor package 100b may be performed using, for example, a sawing process, a drilling process, and/or a cutting process. Through the sectioning off of the single semiconductor package 100b, the semiconductor package 100b according to another example embodiment of the inventive concepts may be formed.

In another example embodiment described above, an example of stacking two semiconductor chips are described, but the number of the stacked semiconductor chips is not limited to two.

Hereinafter, a method of manufacturing a stack-type semiconductor package 100c including semiconductor packages 100b manufactured according to another example embodiment described above will be described with reference to accompanying drawings.

Figure 9:
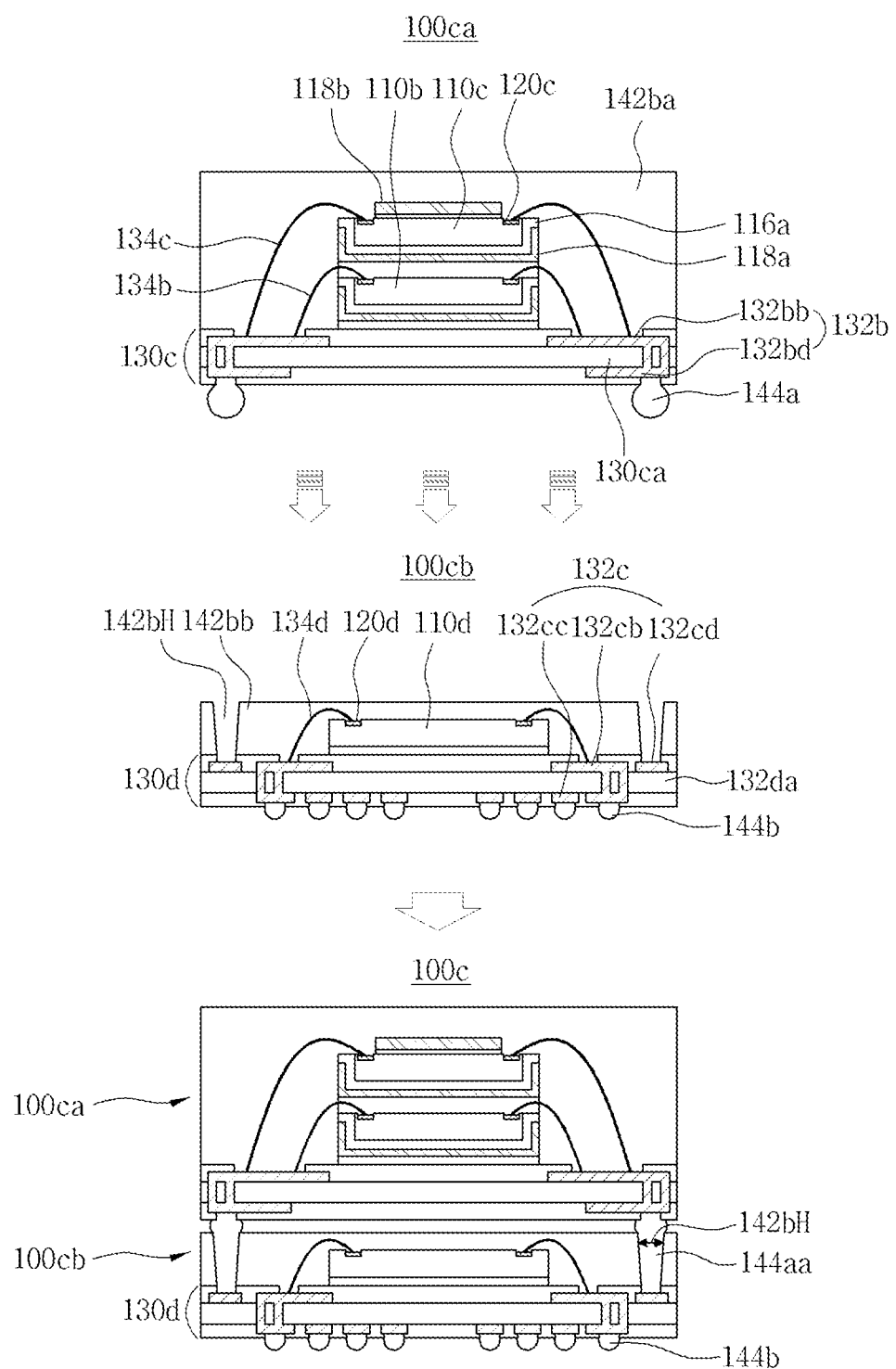
FIG. 9 is a cross-sectional view illustrating a method of manufacturing a stack-type semiconductor package according to at least one example embodiment of the inventive concepts.

FIG. 9 is a cross-sectional view illustrating a method of manufacturing a stack-type semiconductor package 100c according to an example embodiment of the inventive concepts.

Referring to FIG. 9, a method of manufacturing a stack-type semiconductor package 100c according to an example embodiment of the inventive concepts may include manufacturing the first semiconductor package 100ca and the second semiconductor package 100cb individually, and stacking the first and second semiconductor packages 100ca and 100cb on each other.

Since the method of manufacturing the first semiconductor package 100ca was described with reference to FIGS. 8A to 8D, description will be briefly provided.

The method of manufacturing the first semiconductor package 100ca according to an example embodiment of the inventive concepts may include bonding a first semiconductor chip 110b to a first substrate 130c, bonding a first bonding wire 134b to the first semiconductor chip 110b and the first substrate 130c, stacking a second semiconductor chip 110c on the first semiconductor chip 110b, bonding a second bonding wire 134c to the second semiconductor chip 110c and the substrate 130c, and bonding a second shield pattern 118b to an upper surface of the second semiconductor chip 110c.

The first semiconductor chip 110b and the second semiconductor chip 110c may be memory chips including MRAMs. A buffer pattern 116a and a first shield pattern 118a may be formed on a back surface and sides of the first and second semiconductor chips 110b and 110c, and the second shield pattern 118b may be bonded and formed on the upper surface of the second semiconductor chip 110c.

The first substrate 130c may include a first base substrate 130ca, and a first signal wiring unit 132b formed on upper and lower surfaces of the first base substrate 130ca. The first signal wiring unit 132b may include a first bonding pad 132bb formed on the upper surface of the first base substrate 130ca, and a first bump land 132bd formed on the lower surface of the first base substrate 130ca.

Further, the method of manufacturing the first semiconductor package 100ca may include forming a first molding 142ba, and bonding first solder balls 144a to lower surface of the first bump land 132bd exposed downward from the first substrate 130c.

The second semiconductor package 100cb may be manufactured by a method of manufacturing a general semiconductor package. For example, the method of manufacturing the second semiconductor package 100cb according to an example embodiment of the inventive concepts may include bonding a third semiconductor chip 110d to a second substrate 130d, and contemporaneously or simultaneously bonding a third bonding wire 134d to the third semiconductor chip 110d and the second substrate 130d.

The third semiconductor chip 110d may be a logic semiconductor chip in which a logic device is formed. Electrode terminals 120d of the logic device may be exposed through an active surface of the third semiconductor chip 110d.

The second substrate 130d may include a second base substrate 130da, and a second signal wiring unit 132c formed on upper and lower surfaces of the second base substrate 130da.

The second signal wiring unit 132c may include a second bonding pad 132cb and a second bump land 132cd formed on the upper surface of the second base substrate 130da, and lands 132cc formed the lower surface of the second base substrate 130da.

The method of manufacturing the second semiconductor package 100cb according to an example embodiment of the inventive concepts may include forming a second molding 142bb, and forming a through hole 142bH in the second molding 142bb. A bottom surface of the through hole 142bH may be an upper surface of the second bump land 132cd.

The method of manufacturing the second semiconductor package 100cb according to an example embodiment of the inventive concepts may include bonding second solder balls 144b to the lands 132c.

The stacking of the first semiconductor package 100ca and the second semiconductor package 100cb may include forming a package connection bump 144aa by reflowing the first solder ball 144a.

The package connection bump 144aa may fill the through holes 142bH of the second molding 142bb. The package connection bump 144aa may physically and electrically connect the first and second semiconductor packages 100ca and 100cb.

Hereinafter, a method of manufacturing a semiconductor package including the magnetic shield unit formed by the method according to an example embodiment of the inventive concepts will be described with reference to accompanying drawings.

Figure 10A:
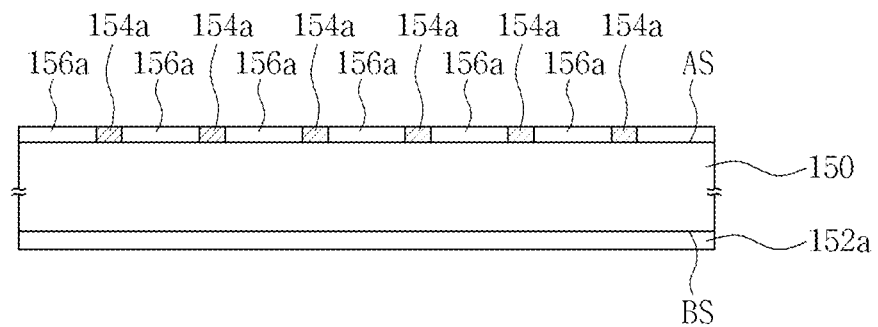
FIGS. 10A to 10N are cross-sectional views illustrating a method of manufacturing a semiconductor package in process sequence according to at least one example embodiment of the inventive concepts.
Figure 10B:
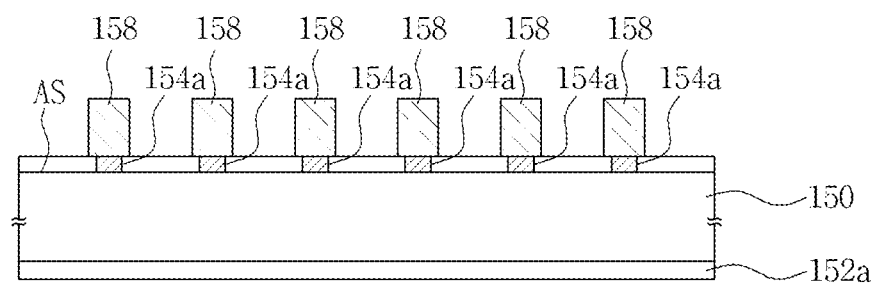
Figure 10C:
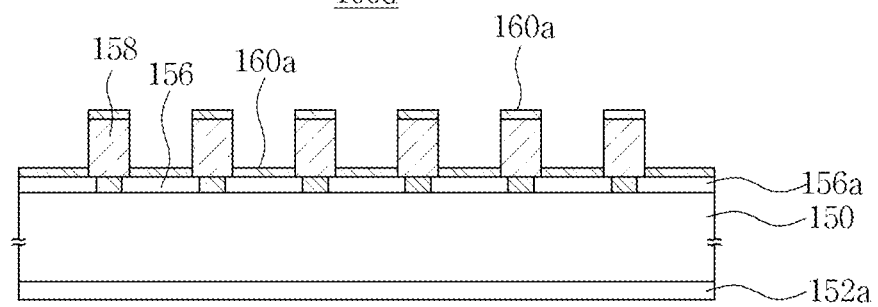
Figure 10D:
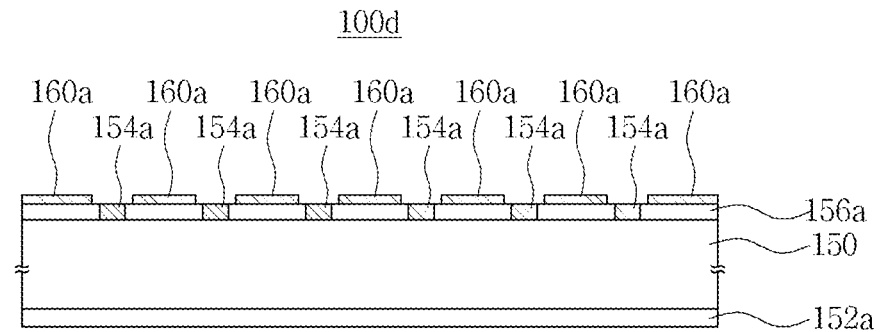
Figure 10E:
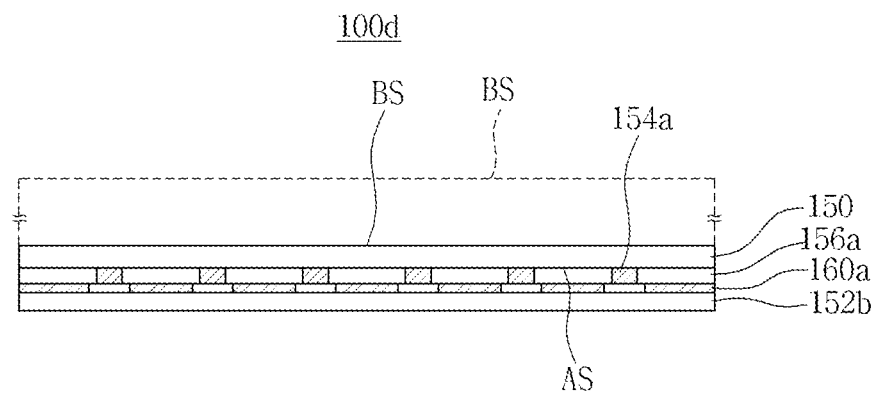
Figure 10F:
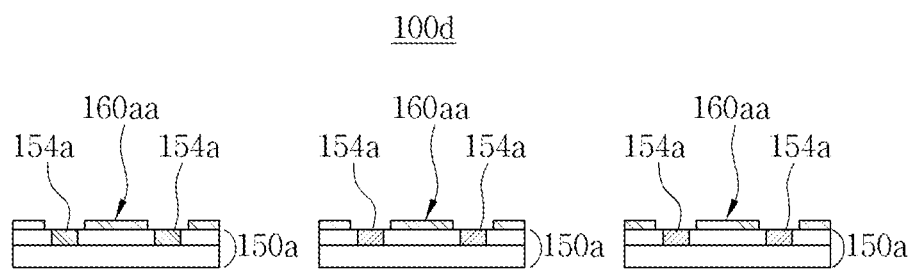
Figure 10G:
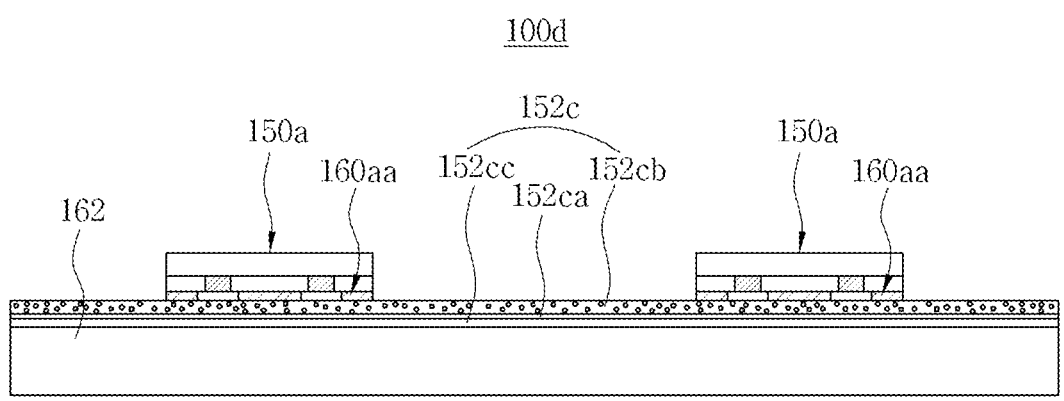
Figure 10H:
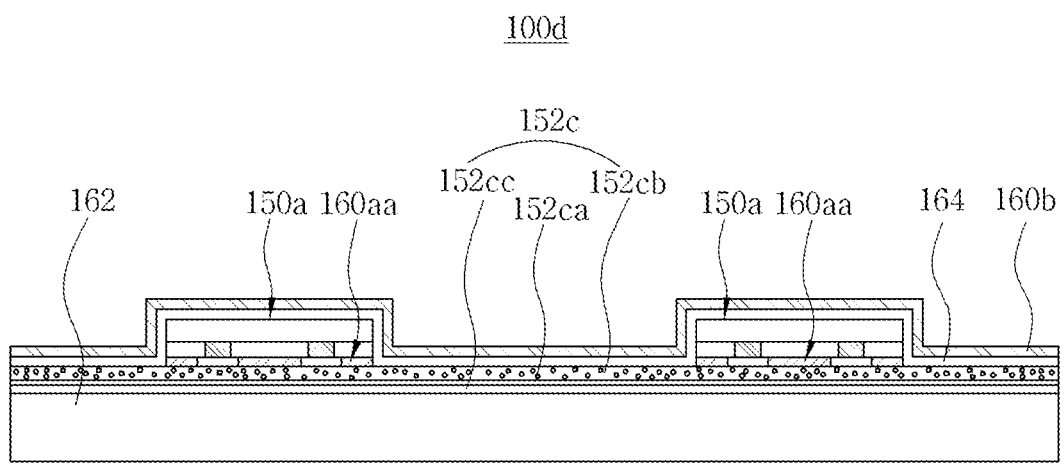
Figure 10I:
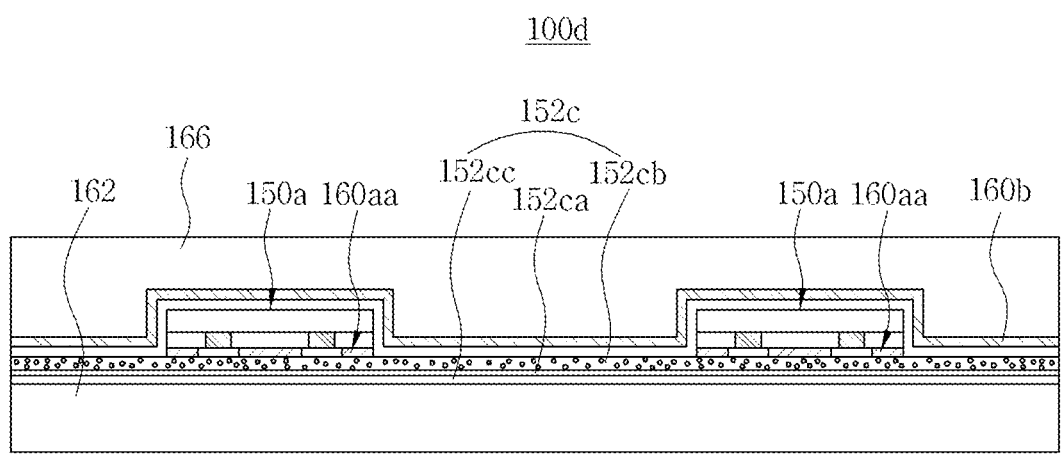
Figure 10J:
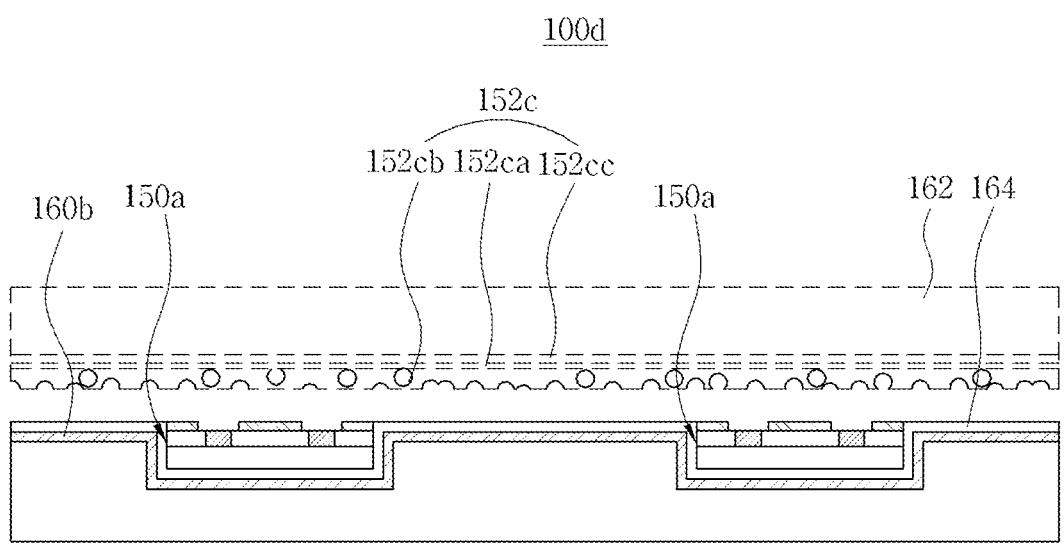
Figure 10K:
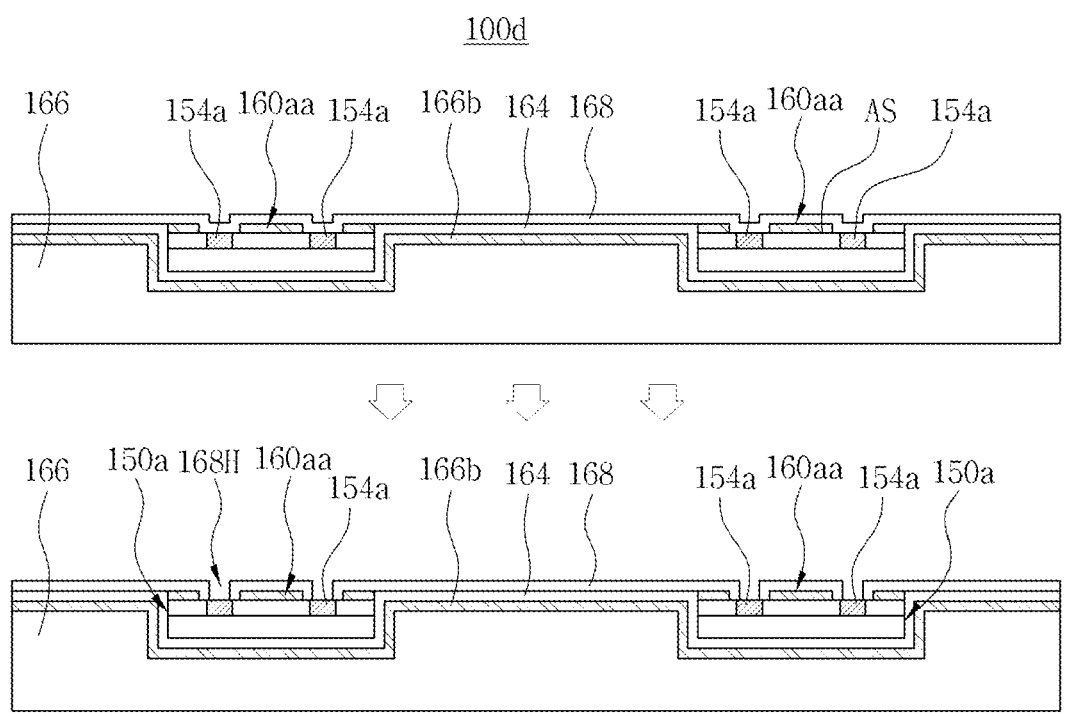
Figure 10L:
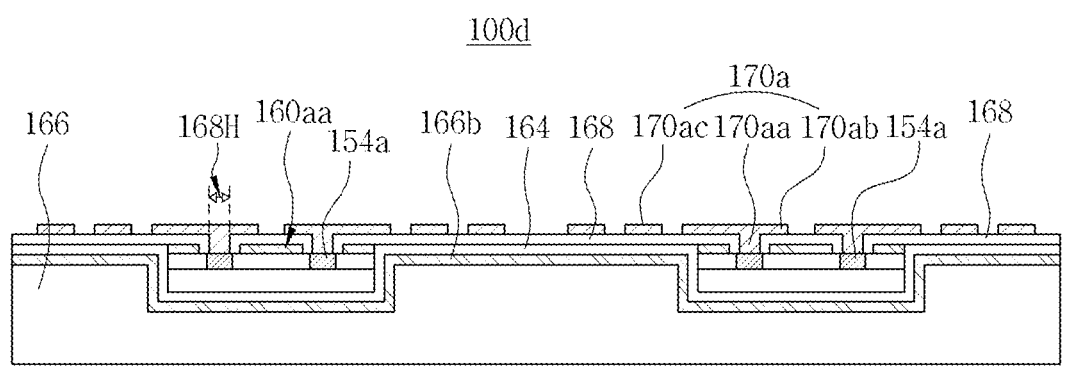
Figure 10M:
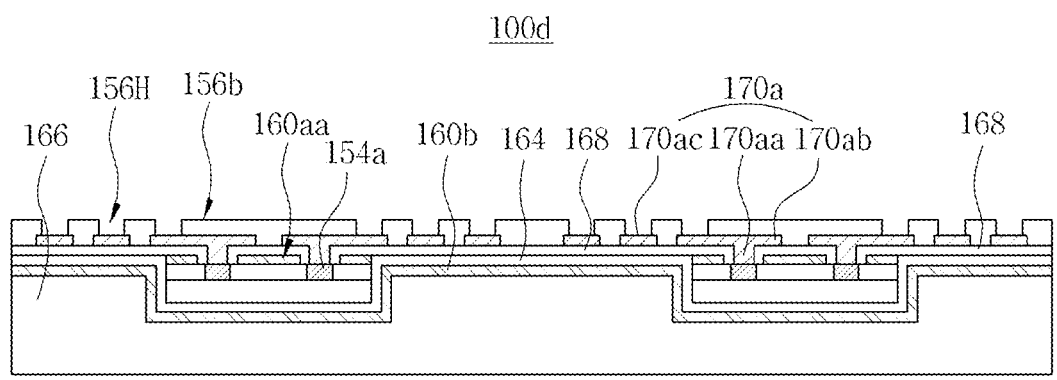
Figure 10N:
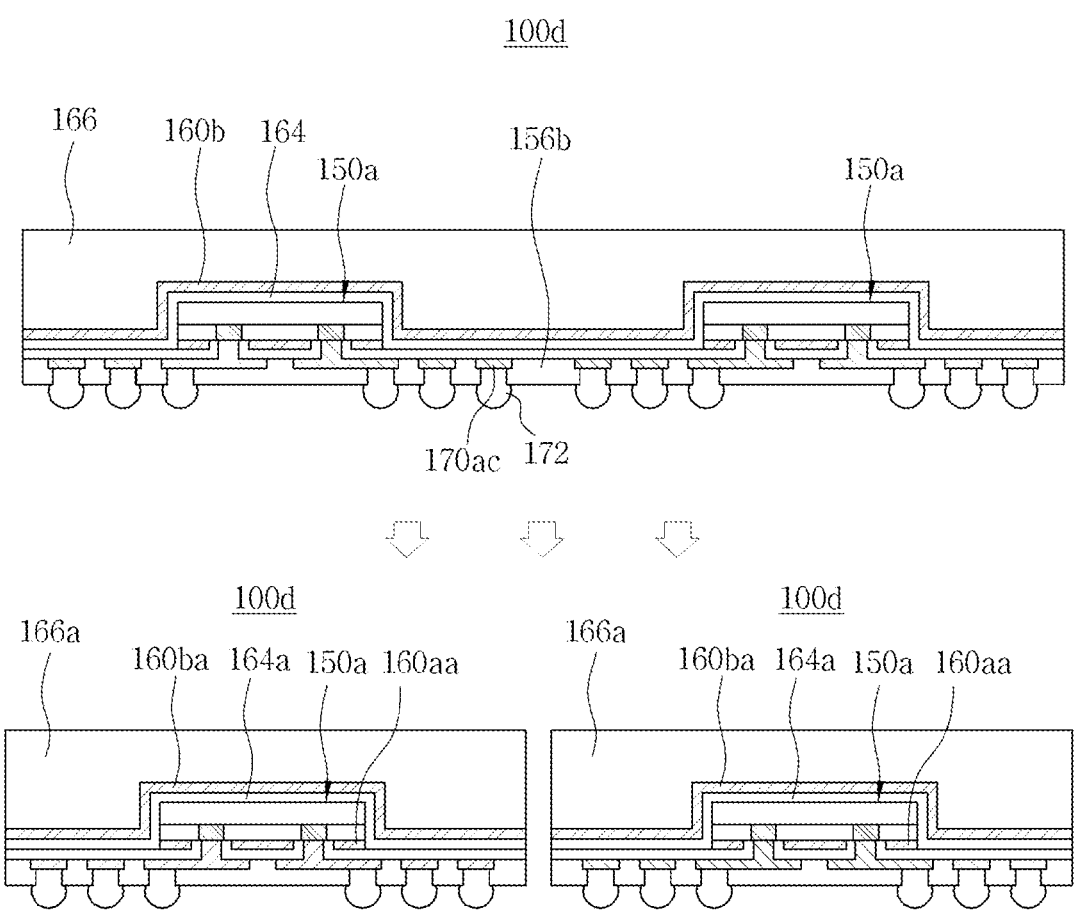

FIGS. 10A to 10N are cross-sectional views illustrating a method of manufacturing a semiconductor package in process sequence according to an example embodiment of the inventive concepts.

Referring to FIG. 10A, a method of manufacturing a semiconductor package 100d according to an example embodiment of the inventive concepts may include bonding a first tape 152a to a back surface BS of a wafer 150.

The other surface of the wafer 150 to which the first tape 152 is not bonded may be an active surface AS.

The wafer 150 may include MRAMs formed from the active surface AS to a constant depth. The wafer 150 may be formed on the active surface AS, and may include electrode terminals 154a which are physically and electrically connected to the MRAMs.

Further, the wafer 150 may include a first protective layer 156a surrounding sides of the electrode terminals 154a. The first protective layer 156a may be formed in the form of surrounding sides excluding surfaces of the electrode terminals 154a.

The first protective layer 156 may include a photosensitive polyimide resin.

Referring to FIG. 10B, the method of manufacturing the semiconductor package 100d according to an example embodiment of the inventive concepts may include forming mask patterns 158 covering exposed surfaces of the electrode terminals 154a.

A lower surface of each of the mask patterns 158 may have a wider area than the upper surface of each of electrode terminals 154a. The forming of the mask patterns 158 may include photolithography. The mask patterns 158 may include a photoresist.

Referring to FIG. 10C, the method of manufacturing the semiconductor package 100d according to an example embodiment of the inventive concepts may include forming a first shield layer 160a on the upper surface of the wafer 150 on which the mask patterns 158 are formed.

The first shield layer 160a may be formed on surfaces of the first protective layer 156a and the mask patterns 158. Although not shown, the first shield layer 160a may be discontinuously formed on sides of the mask patterns 158.

The first shield layer 160a may include a material with high permeability. The first shield layer 160a may include permalloy. The permalloy may be an alloy of Fe and Ni. A method of forming the first shield layer 160a may include a PVD process including a sputter.

Referring to FIG. 10D, the method of manufacturing the semiconductor package 100d according to an example embodiment of the inventive concepts may include removing the mask patterns 158 shown in FIG. 10C.

The removing of the mask patterns 158 may include a lift-off process. While the mask patterns 158 are removed through the lift-off process, the first shield layers 160a formed on the sides and upper surfaces of the mask patterns 158 shown in FIG. 10C may be simultaneously removed.

Accordingly, the electrode terminals 154a may be exposed, in the first shield layer 160a, and only the upper surface of the first protective layer 156a excluding the surfaces of the electrode terminals 154a may remain. The sides of the first protective layer 156a and the sides of the first shield layer 160a may not be vertically aligned. The sides of the first shield layer 160a may be located on the upper surface of the first protective layer 156a.

Referring to FIG. 10E, the method of manufacturing the semiconductor package 100d according to an example embodiment of the inventive concepts may include bonding a second tape 152b on the active surface AS of the wafer 150, and grinding the back surface BS of the wafer 150.

Further, after bonding the second tape 152a, the method of manufacturing the semiconductor package 100d according to an example embodiment of the inventive concepts may include removing the first tape 152a shown in FIG. 10D before grinding the back surface of the wafer 150. The second tape may be a back grinding tape. The back grinding tape 152b may include PVC.

Through the grinding of the back surface of the wafer 150, a thickness of the wafer 150 may become thin and uniform. The thickness of the wafer 150 may be in a range of 0.2 mm to 0.51 mm.

The method of manufacturing the semiconductor package 100d according to an example embodiment of the inventive concepts may also include removing the second tape 152b from the wafer 150, and performing a cleaning process.

Referring to FIG. 10F, the method of manufacturing the semiconductor package 100d according to an example embodiment of the inventive concepts may include sectioning off the wafer 150 of FIG. 10E as a plurality of semiconductor chips 150a.

The sectioning off of the wafer 150 may be performed using, for example, a sawing process, a drilling process, and/or a cutting process.

A first shield pattern 160aa may be formed on an upper surface of each of individual semiconductor chips 150a by the cutting of the first shield layer 160a shown in FIG. 10E.

Referring to FIG. 10G, the method of manufacturing the semiconductor package 100d according to an example embodiment of the inventive concepts may include bonding the semiconductor chips 150a to an upper surface of a carrier 162.

The semiconductor chips 150a may be bonded to the carrier 162 through a third tape 152c bonded to the upper surface of the carrier 162.

The carrier 162 may include steel use stainless (SUS), glass, and a wafer. The third tape 152c may be a double-sided tape. Specifically, the third tape 152c may include a film 152ca, a first adhesive coating layer 152cb coated on one side of the film 152ca and including bubbles, and a second adhesive coating layer 152cc coated on the other side of the film 152ca. The first adhesive coating layer 152cb may be in contact with the first shield patterns 160aa of the semiconductor chips 150a.

The first adhesive coating layer 152cb may have characteristics in which internal bubbles are expanded by heat or light.

Referring to FIG. 10H, the method of manufacturing the semiconductor package 100d according to an example embodiment of the inventive concepts may include forming a buffer layer 164 and a second shield layer 160b on back surface and sides of the semiconductor chips 150a.

The buffer layer 164 may include an insulating layer. The buffer layer 164 may include silicon oxide ($SiO_2$) and silicon nitride (SiNx).

The second shield layer 160b may include a material with high permeability. The first shield layer 160a may include permalloy. The permalloy may be an alloy of Fe and Ni. A method of forming the second shield layer 160b may include a PVD process including a sputter.

Referring to FIG. 10I, the method of manufacturing the semiconductor package 100d according to an example embodiment of the inventive concepts may include forming a molding layer 166 to cover the second shield layer 160b.

The forming of the molding layer 166 may include forming a molding material on an upper surface of the second shield layer 160b, and curing the molding material. The molding material may include EMC.

Referring to FIG. 10J, the method of manufacturing the semiconductor package 100d according to an example embodiment of the inventive concepts may include removing the carrier 162 from the semiconductor chips 150a.

The removing of the carrier 162 may include applying heat or light to the third tape 152c. When the carrier 162 is a transparent material, heat or light may be applied, and when the carrier 162 is an opaque material, heat may be applied.

When heat or light is applied to the third tape 152c, a contact area between the first adhesive coating layer 152cb, the buffer layer 164 and the first shield pattern 160aa may be decreased while the bubbles included in the first adhesive coating layer 152cb expand.

Accordingly, a phenomenon in which a bonding strength of the third tape 152c become weak and the third tape 152c is detached from the first shield pattern 160aa and the buffer layer 164 may occur. Consequently, the third tape 152c and the carrier 162 in contact therewith may be removed from the semiconductor chips 150a.

The plurality of semiconductor chips 150a from which the carrier 162 is removed may share the buffer layer 164, the second shield layer 160b, and the molding layer 166. One surface of the first shield pattern 160aa, which is in contact with the buffer layer 164 and one surface of the buffer layer 164, may be at the same level.

Referring to FIG. 10K, the method of manufacturing the semiconductor package 100d according to an example embodiment of the inventive concepts may include forming an interlayer insulating layer 168 on upper surfaces of the active surfaces AS of the semiconductor chips 150a, and exposing the electrode terminals 154a.

The interlayer insulating layer 168 may be conformingly formed on surfaces of the electrode terminals 154a of the semiconductor chips 150a, upper surfaces and sides of the first shield patterns 160aa, and surface of the buffer layer 164.

The interlayer insulating layer 168 may include silicon nitride and silicon oxide.

The exposing of the electrode terminals 154a may include patterning the interlayer insulating layer 168a, and forming through holes 168H of exposing the surfaces of the electrode terminals 154a. Photolithography may be performed to form the through holes 168H in the interlayer insulating layer 168.

Through the process described above, the surfaces of the electrode terminals 154a may be exposed, and the interlayer insulating layer 168 may cover the upper surfaces and sides of the first shield patterns 160aa. This structure can prevent the first shield patterns 160aa and the electrode terminals 154a from being electrically short-circuited.

Referring to FIG. 10L, the method of manufacturing the semiconductor package 100d according to an example embodiment of the inventive concepts may include forming a rewiring unit 170a which is physically and electrically connected to the exposed surfaces of the electrode terminals 154a.

The forming of the rewiring unit 170a may include forming vias 170aa filling the through holes 168H, forming a signal wiring 170ab so that the signal wiring 170ab is formed in one body with the vias 170aa and extends to an edge of the semiconductor chip 150a, and forming lands 170ac in a direction from the edge of the semiconductor chip 150a to the outside.

The rewiring unit 170a may be formed of a conductive metal material including copper (Cu), aluminium (Al), and gold (Au)

Referring to FIG. 10M, the method of manufacturing the semiconductor package 100d according to an example embodiment of the inventive concepts may include forming a second protective layer 156b covering the rewiring unit 170a, and exposing the surfaces of the lands 170ac.

The exposing of the surfaces of the lands 170ac may include patterning the second protective layer 156b, and forming through holes 156bH corresponding to the surfaces of the lands 170ac. Photolithography may be used to form the through holes 156H.

The second protective layer 156b may include silicon oxide, silicon nitride, and a photosensitive resin. For example, when a material forming the second protective layer 156b is a photosensitive polyimide resin, since they include characteristics of photoresists, the through holes 156H may be formed when performing a developing process after a process of transferring the mask pattern.

Referring to FIG. 10N, the method of manufacturing the semiconductor package 100d according to an example embodiment of the inventive concepts may include forming solder balls 172 in contact with the lands 170ac, and sectioning off a single semiconductor package 100d including each of the semiconductor chips 150a.

The solder balls 172 may be bonded to the lands 170ac while filling the through holes 156H shown in FIG. 10E.

The sectioning off of the single semiconductor package 100d may be performed using, for example, a sawing process, a drilling process, and/or a cutting process. Through the sectioning off of the single semiconductor package 100d, the semiconductor package 100d according to an example embodiment of the inventive concepts may be formed. The buffer layer 164, the second shield layer 160b, and the molding layer 166 may be cut while sectioning off the single semiconductor package 100d. Accordingly, the semiconductor chip 150a may have a structure where a buffer pattern 164a, a second shield pattern 160ba, and a molding 166a are sequentially stacked on the upper surface and sides of the semiconductor chip 150a.

Hereinafter, a method of manufacturing a stack-type semiconductor package according to an example embodiment of the inventive concepts formed according to the processes of FIGS. 10A to 10N described above will be described with reference to accompanying drawings.

Figure 11:
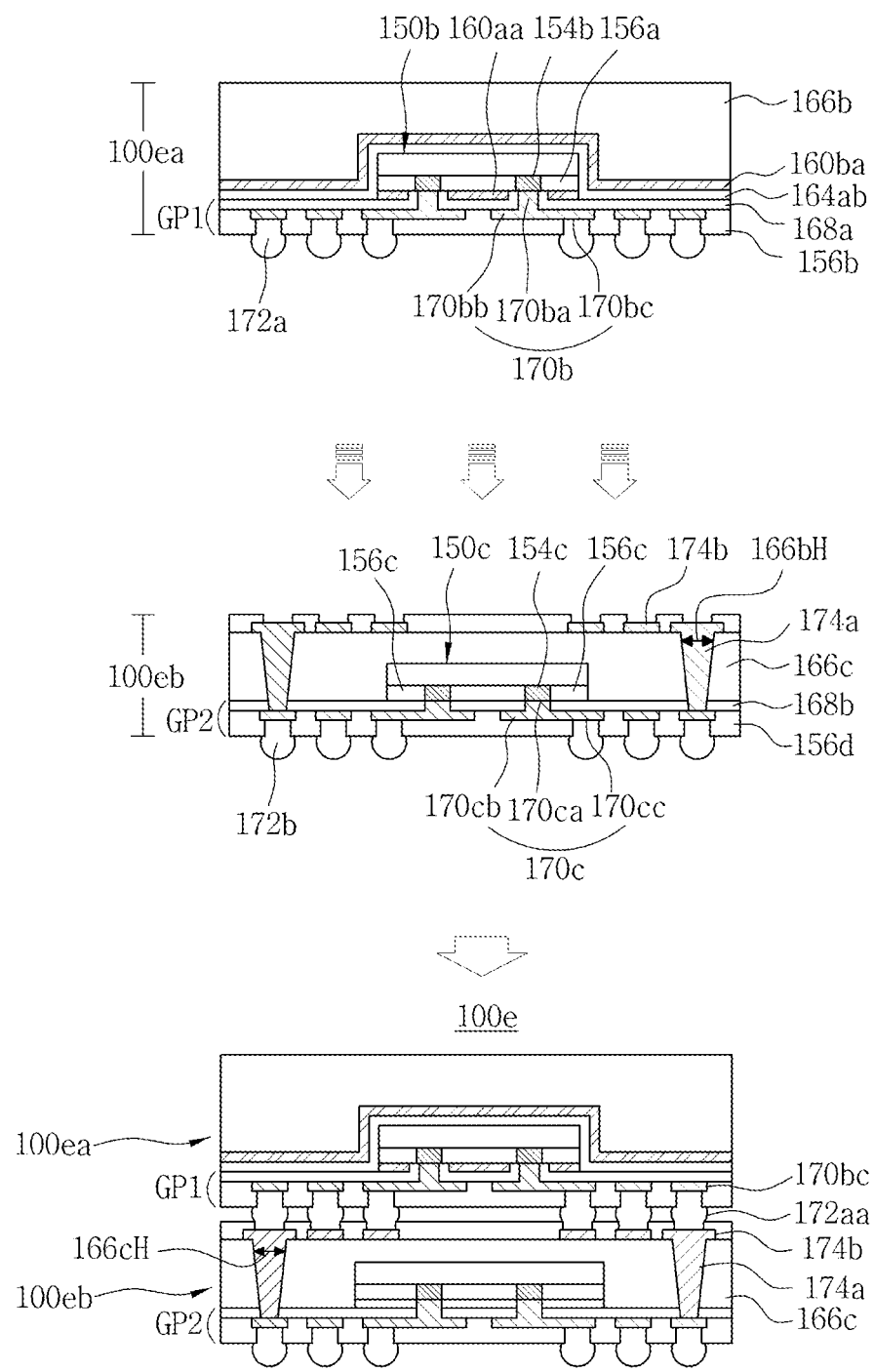
FIG. 11 is a cross-sectional view illustrating a method of manufacturing a stack-type semiconductor package according to at least one example embodiment of the inventive concepts.

FIG. 11 is a cross-sectional view illustrating a method of manufacturing a stack-type semiconductor package according to an example embodiment of the inventive concepts.

Referring to FIG. 11, a method of manufacturing a stack-type semiconductor package 100e according to an example embodiment of the inventive concepts may include manufacturing the first semiconductor package 100ea and the second semiconductor package 100eb separately, and stacking the first and second semiconductor packages 100ea and 100eb on each other.

Since a method of manufacturing the first semiconductor package 100ea was described with reference to FIGS. 10A to 10N described above, description will be briefly provided.

The method of manufacturing the first semiconductor package 100ea may include forming a first shield pattern 160ab on an active surface of a first semiconductor chip 150b, and forming a buffer pattern 164b, a second shield pattern 160bb, and a first molding 166b on back and upper surfaces of the first semiconductor chip 150b.

The surfaces of the first electrode terminals 154b may be exposed on the active surface of the first semiconductor chip 150b, and the sides of the first electrode terminals 154b may be in lateral contact with the first protective layer 156a.

After the process of forming the first molding 166b, the example method of manufacturing the first semiconductor package 100ea may include forming a first semiconductor chip support unit GP1 supporting the first semiconductor chip 150b on the active surface of the first semiconductor chip 150b, and forming first solder balls 172a on a lower surface of the first semiconductor chip support unit GP1.

The forming of the first semiconductor chip support unit GP1 may include forming a first interlayer insulating layer 168a covering the first shield pattern 160ab, and forming a first rewiring unit 170b and a second protective layer 156b covering the first rewiring unit 170b on a surface of the first interlayer insulating layer 168a.

The first rewiring unit 170b may include vias 170ba, signal wirings 170bb, and first bump lands 170bc.

The second protective layer 156b may be in lateral contact with the first bump lands 170bc. Lower surfaces of the first bump lands 170bc may be exposed.

The example method of manufacturing the first semiconductor package 100ea may include bonding solder balls 172a which are in contact with the first bump lands 170bc.

A method of manufacturing the second semiconductor package 100eb according to at least one example embodiment may include forming a second molding 166c covering sides and an upper surface of a second semiconductor chip 150c, and forming a through hole 166bH in the second molding 166c.

The second semiconductor chip 150c may be a logic semiconductor chip including a logic device. Second electrode terminals 154c may be formed on an active surface of the second semiconductor chip 153c, and the sides of the second electrode terminals 154c may be in lateral contact with a third protective layer 156c. Lower surfaces of the second electrode terminals 154c may be exposed.

The lower surfaces of the third protective layer 156c and the second molding 166c may be in the same level.

An example method of manufacturing the second semiconductor chip 150c may include forming a second semiconductor support unit GP2 which is in contact with the lower surface of the second molding 166c and the lower surface of the third protective layer 156c, and supporting the second semiconductor chip 150c.

The forming of the second semiconductor support unit GP2 may include forming a second interlayer insulating layer 168b, a second rewiring unit 170c, and a fourth protective layer 156d.

The forming of the second rewiring unit 170c may include forming a via 170ca which is in contact with the second electrode terminal 154c of the second semiconductor chip 150c, forming a second signal wiring 170cb so that the second signal wiring 170cb is formed in one body with the via 170ca, and forming lands 170cc on a lower surface of the second interlayer insulating layer 168b which is not in contact with the second semiconductor chip 150c.

The example method of manufacturing the second semiconductor chip 150c may further include forming a land connection bump 174a filling the through hole 166bH, and forming second bump lands 174b which are physically and electrically connected to the land connection bumps 174.

Further, the example method of manufacturing the second semiconductor chip 150c may include forming a fourth protective layer 156d which is in lateral contact with the lands 170cc, and bonding second solder balls 172b to the lands 170cc.

The stacking of the first and second semiconductor packages 100ea and 100eb may include forming a package connection bump 172aa by reflowing the first solder balls 172b.

Figure 12:
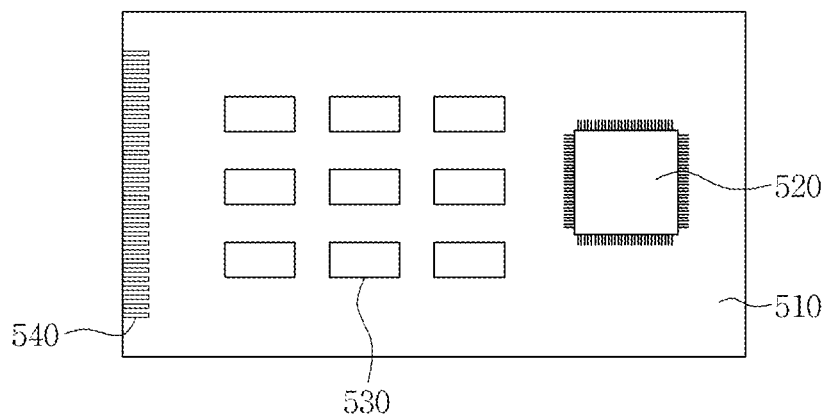
FIG. 12 is a schematic diagram illustrating a semiconductor module according to an example embodiment of the inventive concepts including a semiconductor package manufactured according to example embodiments of the inventive concepts.

The package connection bump 172aa may physically connect the first bump lands 170bc and the second bump lands 174b. Accordingly, the first and second semiconductor packages 100ea and 100eb may be physically and electrically connected by the package connection bump 172aa. FIG. 12 is a schematic diagram illustrating a semiconductor module according to an example embodiment of the inventive concepts including semiconductor packages 100a, 100b, and 100d manufactured according to example embodiments of the inventive concepts.

Referring to FIG. 12, a semiconductor module 500 according to an example embodiment of the inventive concepts may include memory chips 530 disposed on a semiconductor module board 510. The memory chips 530 may include the semiconductor packages 100a, 100b and 100d according to example embodiments of the inventive concepts. The semiconductor module 500 may further include a microprocessor 520 mounted on the semiconductor module board 510. Input and output terminals 540 may be disposed on at least one side of the semiconductor module board 510. The semiconductor module 500 may include a memory card or a solid state drive (SSD).

Figure 13:
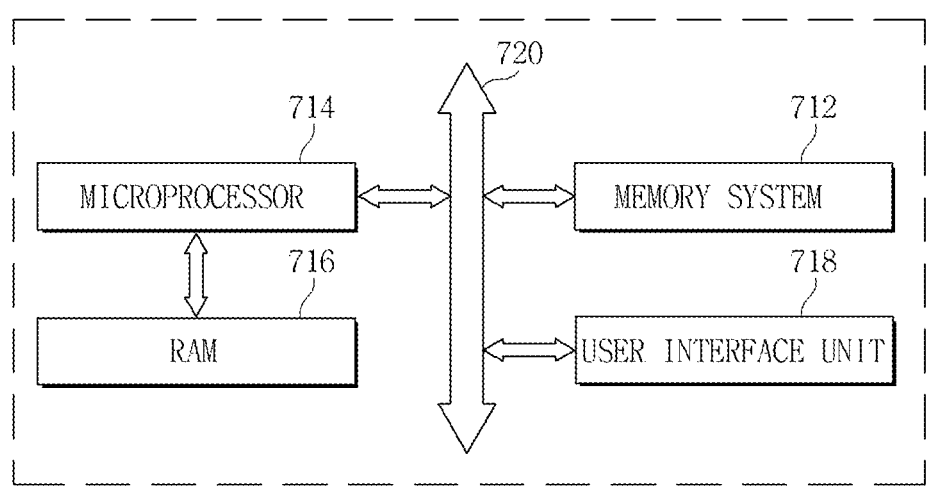
FIG. 13 is a schematic block diagram illustrating an electronic system according to an example; embodiment of the inventive concepts including a semiconductor package manufactured according to example embodiments of the inventive concept.

FIG. 13 is a schematic block diagram illustrating an electronic system according to an example embodiment of the inventive concepts including a semiconductor package manufactured according to example embodiments of the inventive concepts.

Referring to FIG. 13, an electronic system 700 may include the semiconductor packages 100a, 100b, 100c, 100d, and 100e manufactured according to example embodiments of the inventive concepts.

The electronic system 700 may be applied to a mobile electronic device or a computer. For example, the electronic system 700 may include a memory system 712, a microprocessor 714, a random access memory (RAM) 716, and a user interface unit 718 for performing data communication using a bus 720. The microprocessor 714 may program or control the electronic system 700. The RAM 716 may be used as an operation memory of the microprocessor 714. For example, the microprocessor 714 or the RAM 716 may optionally include the semiconductor packages 100a, 100b, 100c, 100d, and 100e according to embodiments of the inventive concepts.

The microprocessor 714, RAM 716, and/or other elements may be assembled in a single package. The user interface unit 718 may be used to input data from the electronic system 700, or output data to the electronic system 700. The memory system 712 may store codes for operating the microprocessor 714, data processed by the microprocessor 714, or data input from the outside. The memory system 712 may include a controller and a memory.

Figure 14:
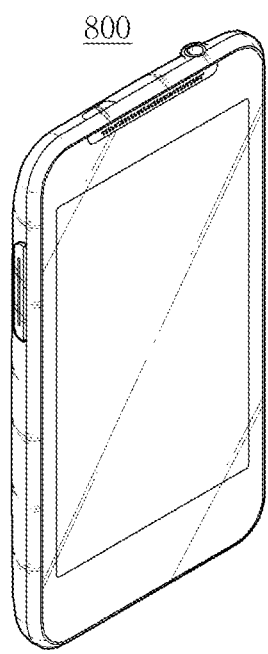
FIG. 14 is a schematic diagram illustrating a mobile electronic device according to an example embodiment of the inventive concepts including a semiconductor device manufactured according to example embodiments of the inventive concepts

FIG. 14 is a schematic diagram illustrating a mobile electronic device according to an example embodiment of the inventive concepts including a semiconductor device manufactured according to example embodiments of the inventive concepts.

The mobile electronic device may be a tablet or personal computer (PC). Further, the semiconductor packages 100a, 100b, 100c, 100d, and 100e manufactured according to various example embodiments of the inventive concepts may be used for a mobile computer such as a notebook, a MPEG-1 audio layer 3 (MP3) player, a MP4 player, a navigation device, a SSD, a table computer, an automobile, and home electronic appliances, in addition to the tablet PC.

Figure 15:
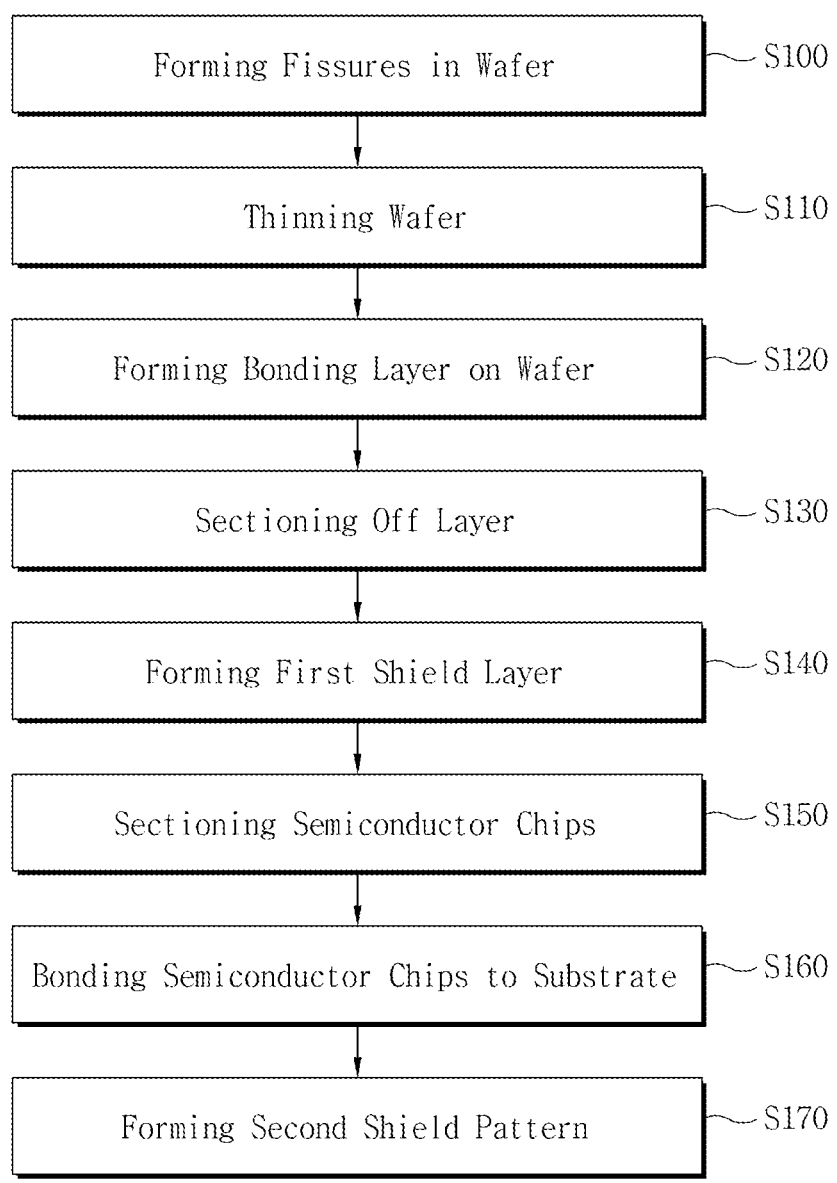
FIG. 15 is a flow chart illustrating a method of manufacturing a magnetically shielded semiconductor package, according to at least one example embodiment.

FIG. 15 is a flow chart illustrating a method of manufacturing a magnetically shielded semiconductor package, according to at least one example embodiment. In FIG. 15, the method starts at S100, where one or more fissures are formed in a lattice structure on an active surface of a wafer. At S110, the wafer is thinned via, for example, grinding, to a desired thickness. A tape is bonded to the active layer of the wafer at S120. The layer and the wafer are sectioned off into a plurality of sections corresponding to semiconductor chips at S130. At S140, a first shield layer is formed on surfaces of the semiconductor chips and on the tape. When the first shield layer is formed, the semiconductor chips are sectioned off at S150, each semiconductor chip having an active surface and a first shield pattern on a back surface and sides thereof. At S160, the semiconductor chips are bonded to a substrate, and a second shield pattern is formed on the active surface of the semiconductor chips at S170.

The methods of manufacturing semiconductor packages according to example embodiments of the inventive concepts can effectively shield the semiconductor chips from an influx of an external magnetic field since a magnetic shield unit can be formed on an entire surface of a single semiconductor chip.

The foregoing is illustrative of example embodiments and is not to be construed as limiting thereof. Although a few example embodiments have been described, those skilled in the art will readily appreciate that many modifications are possible without materially departing from the novel teachings and advantages. Accordingly, all such modifications are intended to be included within the scope of the inventive concepts as defined in the claims. In the claims, means-plus-function clauses are intended to cover the structures described herein as performing the recited function, and not only structural equivalents but also equivalent structures.

What is claimed is:

1. A method of manufacturing a semiconductor package, comprising:
    forming cracks in a lattice structure on an active surface of a wafer in which electrode terminals are formed;
    grinding a back surface of the wafer facing the active surface;
    bonding a tape on the active surface of the wafer;
    expanding the tape such that the wafer on the tape is divided into a plurality of sections, each section corresponding to a semiconductor chip;
    forming a shield layer on surfaces of the semiconductor chips and the tape;
    cutting the shield layer between the semiconductor chips, and sectioning off each of the semiconductor chips, each semiconductor chip having an active surface and a first shield pattern on a back surface and sides thereof;
    bonding the semiconductor chips to a substrate; and
    forming a second shield pattern on each active surface of the semiconductor chips,
    wherein the semiconductor chips and the substrate are connected by a bonding wire.

2. The method of manufacturing the semiconductor package according to claim 1, wherein the forming of the cracks in the lattice structure of the wafer comprises irradiating the active surface of the wafer with a laser beam.

3. The method of manufacturing the semiconductor package according to claim 1, wherein the bonding of the semiconductor chips to the substrate comprises bonding an adhesive film on an upper surface of the shield layer, forming a first bonding layer on a lower surface of the first shield pattern by contemporaneously cutting the shield layer and the adhesive film, and bonding the first bonding layer to the substrate.

4. The method of manufacturing the semiconductor package according to claim 1, further comprising forming a buffer layer between the semiconductor chips and the shield layer.

5. The method of manufacturing the semiconductor package according to claim 1, further comprising:
   forming a molding enveloping the semiconductor chips and the bonding wire; and
   cutting the molding and the substrate, and sectioning off one or more single semiconductor package each including a semiconductor chip.

6. The method of manufacturing the semiconductor package according to claim 1, further comprising stacking another substantially identical semiconductor chip on the semiconductor chip and between the semiconductor chip and the second shield pattern.

7. The method of manufacturing the semiconductor package according to claim 6, further comprising forming an inter chip bonding layer between the stacked semiconductor chips to cover one end of the bonding wire and to bond the stacked semiconductor chips.

8. The method of manufacturing the semiconductor package according to claim 7, wherein the inter chip bonding layer comprises at least one of an epoxy-based resin and a silicon-based resin.

9. The method of manufacturing the semiconductor package according to claim 1, wherein the forming of the second shield pattern comprises bonding the previously manufactured second shield pattern in the form of a thin film on the surfaces of the semiconductor chips.

10. The method of manufacturing the semiconductor package according to claim 1, wherein at least one of the first shield pattern and the second shield pattern comprises permalloy.

11. A method of manufacturing a semiconductor package, comprising:
   preparing a semiconductor wafer having an active surface in which electrode terminals are formed, and a back surface opposite the active surface;
   forming a first shield layer on portions of the active surface that do not include the electrode terminals;
   grinding the back surface of the wafer;
   cutting the wafer including the first shield layer, and sectioning off a plurality of semiconductor chips each having a first shield pattern formed on the active surface;
   bonding the semiconductor chips to a carrier so that back sides and sides of the semiconductor chips are exposed;
   forming a second shield layer on the back surface and sides of the semiconductor chips and on an upper surface of the carrier;
   forming a molding layer on an upper surface of the second shield layer; and
   removing the carrier.

12. The method of manufacturing the semiconductor package according to claim 11, wherein the forming of the first shield layer comprises:
   forming mask patterns each having a wider area than a surface area of each corresponding electrode terminal and covering the electrode terminals;
   conformally forming a first shield layer on a surface of a protective layer which is not covered by the mask patterns and on surfaces of the mask patterns; and
   keeping the first shield layer only on portions of the surface of the protective layer that do not include the electrode terminals by removing the mask patterns.

13. The method of manufacturing the semiconductor package according to claim 11, further comprising forming an interlayer insulating layer covering the first shield layer and exposing the electrode terminals.

14. The method of manufacturing the semiconductor package according to claim 11, further comprising forming a rewiring unit including vias connected to the electrode terminals, signal wirings connected to the vias, and lands connected to the signal wirings and formed at an outside edge of the semiconductor wafer.

15. The method of manufacturing the semiconductor package according to claim 14, further comprising cutting the molding layer, the second shield layer, and the rewiring unit between the semiconductor chips, sectioning off at least one single semiconductor package, and providing a second shield pattern covering the back surfaces and sides of the semiconductor chips and a molding covering the second shield pattern.

16. A method of manufacturing a magnetically shielded semiconductor package, comprising:
   forming one or more fissures in a lattice structure of a wafer on an active surface thereof;
   thinning the wafer;
   forming a layer at the active surface of the wafer;
   sectioning the wafer on the layer into a plurality of sections, each section corresponding to a semiconductor chip;
   forming a first shield layer on surfaces of the semiconductor chips and the layer;
   sectioning off each of the semiconductor chips, each semiconductor chip having an active surface and a first shield pattern on a back surface and sides thereof;
   bonding one or more of the semiconductor chips to a substrate; and
   forming a second shield pattern on the active surface of each of the one or more semiconductor chips.

17. The method of claim 16, wherein thinning the wafer comprises having a wafer thickness such that the one or more fissures extend from the active surface to the back surface of the wafer.

18. The method of claim 16, wherein:
   forming the layer comprises bonding a tape to the active surface of the wafer; and
   sectioning the wafer comprises expanding the bonding tape in at least one direction parallel to the active surface.

19. The method of claim 16, wherein the second shield pattern is formed on the active surface of the one or more semiconductor chips via a bonding layer.

20. The method of claim 16, further comprising:
   covering one or more of the semiconductor chips by a molding; and sectioning off the molding to form one or more molding layers corresponding to the one or more semiconductor chips.

* * * * *